(12) United States Patent
Perreault et al.

(10) Patent No.: US 9,768,731 B2
(45) Date of Patent: *Sep. 19, 2017

(54) LINEARITY AND NOISE IMPROVEMENT FOR MULTILEVEL POWER AMPLIFIER SYSTEMS USING MULTI-PULSE DRAIN TRANSITIONS

(71) Applicant: Eta Devices, Inc., Cambridge, MA (US)

(72) Inventors: David J. Perreault, Andover, MA (US); Joel L. Dawson, Roslindale, MA (US); Wei Li, Monterey, CA (US); Yevgeniy A. Tkachenko, Belmont, MA (US); Balaji Lakshminarayanan, Woburn, MA (US); John Hoversten, Lafayette, CO (US)

(73) Assignee: Eta Devices, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/968,045

(22) Filed: Dec. 14, 2015

(65) Prior Publication Data

US 2016/0099686 A1    Apr. 7, 2016

Related U.S. Application Data

(63) Continuation-in-part of application No. 14/934,760, filed on Nov. 6, 2015, now Pat. No. 9,490,752, which
(Continued)

(51) Int. Cl.
*H04B 1/04* (2006.01)
*H03F 1/02* (2006.01)
(Continued)

(52) U.S. Cl.
CPC ......... *H03F 1/0211* (2013.01); *H03F 1/0227* (2013.01); *H03F 3/19* (2013.01);
(Continued)

(58) Field of Classification Search
CPC ..... H04B 1/04; H03F 1/04; H03F 1/02; H03F 3/68; H03F 1/025; H03F 3/60; H03F 3/20;
(Continued)

(56) References Cited

U.S. PATENT DOCUMENTS 4,129,839 A   12/1978 Galani et al.
4,835,493 A   5/1989 Walsh, Jr.
(Continued)

FOREIGN PATENT DOCUMENTS

EP   1 381 154 A1   1/2004
EP     170 366 A2   2/2007
(Continued)

OTHER PUBLICATIONS

U.S. Appl. No. 14/974,563, filed Dec. 18, 2015, Perreault et al.
(Continued)

*Primary Examiner* — Pablo Tran
(74) *Attorney, Agent, or Firm* — Daly, Crowley, Mofford & Durkee, LLP

(57) ABSTRACT

Described embodiments provide a radio frequency (RF) amplifier system having at least one amplifier. The at least one amplifier includes an RF input port, an RF output port and a drain bias port. At least one voltage modulator is coupled to the bias port of the least one amplifier to provide a bias voltage. The bias voltage is selected by switching among a plurality of discrete voltages. At least one filter circuit is coupled between the at least one voltage modulator and the at least one amplifier. The at least one filter circuit controls spectral components resultant from transitions in
(Continued)

the bias voltage when switching among the plurality of discrete voltages. A controller dynamically adapts at least one setting of the at least one voltage modulator by using multi-pulse transitions when switching among the plurality of discrete voltages for a first operating condition of the RF amplifier.

25 Claims, 12 Drawing Sheets

Related U.S. Application Data is a continuation of application No. 14/666,965, filed on Mar. 24, 2015, now Pat. No. 9,209,758, which is a continuation of application No. 14/338,671, filed on Jul. 23, 2014, now Pat. No. 9,020,453.

(60) Provisional application No. 62/091,730, filed on Dec. 15, 2014.

(51) Int. Cl.
| | |
|---|---|
| H03F 3/68 | (2006.01) |
| H03F 3/19 | (2006.01) |
| H03F 3/21 | (2006.01) |
| H03G 3/30 | (2006.01) |
| H03F 3/24 | (2006.01) |
| H03G 3/00 | (2006.01) |

(52) U.S. Cl.
CPC .............. *H03F 3/21* (2013.01); *H03F 3/211* (2013.01); *H03F 3/245* (2013.01); *H03G 3/004* (2013.01); *H03G 3/3042* (2013.01); *H04B 1/0475* (2013.01); *H04B 1/0483* (2013.01); *H03F 2200/451* (2013.01); *H03F 2200/504* (2013.01); *H03F 2200/511* (2013.01); *H03F 2200/555* (2013.01); *H03F 2203/21106* (2013.01); *H04B 2001/045* (2013.01)

(58) Field of Classification Search
CPC .......... H03F 3/21; H03F 1/0294; H03F 3/602; H03F 3/211; H03F 2203/21163
USPC ......... 455/127.3, 91, 102, 103, 114.1, 115.1, 455/115.2, 118, 126, 127.1, 127.2, 127.4; 375/296, 297; 330/124 R, 127, 129, 149
See application file for complete search history.

(56) References Cited

U.S. PATENT DOCUMENTS

| | | | |
|---|---|---|---|
| 5,012,200 A | 4/1991 | Meinzer | |
| 5,561,395 A | 10/1996 | Melton et al. | |
| 5,847,602 A | 12/1998 | Su | |
| 5,892,395 A | 4/1999 | Stengel et al. | |
| 6,043,707 A | 3/2000 | Budnik | |
| 6,081,161 A | 6/2000 | Dacus et al. | |
| 6,133,788 A | 10/2000 | Dent | |
| 6,140,807 A | 10/2000 | Vannatta et al. | |
| 6,255,906 B1 | 7/2001 | Eidson et al. | |
| 6,327,462 B1 | 12/2001 | Loke et al. | |
| 6,377,117 B2 | 4/2002 | Oskowsky et al. | |
| 6,396,341 B1 | 5/2002 | Pehlke | |
| 6,411,655 B1 | 6/2002 | Holden et al. | |
| 6,449,465 B1 | 9/2002 | Gailus et al. | |
| 6,535,066 B1 | 3/2003 | Petsko | |
| 6,566,944 B1 | 5/2003 | Pehlke et al. | |
| 6,646,501 B1 | 11/2003 | Wessel | |
| 6,657,876 B2 | 12/2003 | Satoh | |
| 6,738,432 B2 | 5/2004 | Pehlke et al. | |
| 6,784,748 B1 | 8/2004 | Canyon et al. | |
| 6,788,151 B2 | 9/2004 | Shvarts et al. | |
| 6,791,417 B2 | 9/2004 | Pengelly et al. | |
| 6,799,020 B1 | 9/2004 | Heidmann et al. | |
| 6,975,166 B2 | 12/2005 | Grillo et al. | |
| 6,995,995 B2 | 2/2006 | Zeng et al. | |
| 7,068,984 B2 | 6/2006 | Mathe et al. | |
| 7,091,772 B2 | 8/2006 | Friedel et al. | |
| 7,103,114 B1 | 9/2006 | Lapierre | |
| 7,202,655 B2 | 4/2007 | Itoh | |
| 7,236,542 B2 | 6/2007 | Matero | |
| 7,236,753 B2 | 6/2007 | Zipper | |
| 7,279,971 B2 | 10/2007 | Hellberg et al. | |
| 7,317,412 B2* | 1/2008 | Li | H03M 1/1061 341/144 |
| 7,330,070 B2 | 2/2008 | Vaisanen | |
| 7,343,138 B2 | 3/2008 | Bengtson et al. | |
| 7,362,251 B2 | 4/2008 | Jensen et al. | |
| 7,411,449 B2 | 8/2008 | Klingberg et al. | |
| 7,420,415 B2* | 9/2008 | Lee | H03G 3/004 330/136 |
| 7,423,477 B2 | 9/2008 | Sorrells et al. | |
| 7,440,733 B2 | 10/2008 | Maslennikov et al. | |
| 7,469,017 B2* | 12/2008 | Granstom | H04B 1/0483 370/319 |
| 7,474,149 B2 | 1/2009 | Snelgrove et al. | |
| 7,482,869 B2 | 1/2009 | Wilson | |
| 7,505,747 B2 | 3/2009 | Solum | |
| 7,512,387 B2 | 3/2009 | Glueck | |
| 7,535,133 B2 | 5/2009 | Perreault et al. | |
| 7,555,059 B2 | 6/2009 | Rybicki et al. | |
| 7,583,149 B2 | 9/2009 | Funaki et al. | |
| 7,589,605 B2 | 9/2009 | Perreault et al. | |
| 7,705,681 B2 | 4/2010 | Ilkov | |
| 7,715,811 B2 | 5/2010 | Kenington | |
| 7,724,839 B2* | 5/2010 | Chen | H03F 1/0205 375/296 |
| 7,817,962 B2* | 10/2010 | Zolfaghari | H03C 5/00 455/127.3 |
| 7,881,401 B2* | 2/2011 | Kraut | H03C 5/00 375/135 |
| 7,889,519 B2 | 2/2011 | Perreault et al. | |
| 7,907,429 B2 | 3/2011 | Ramadass et al. | |
| 7,956,572 B2 | 6/2011 | Zane et al. | |
| 7,962,111 B2 | 6/2011 | Solum | |
| 8,009,765 B2 | 8/2011 | Ahmed et al. | |
| 8,026,763 B2 | 9/2011 | Dawson et al. | |
| 8,072,264 B2 | 12/2011 | Gustavsson | |
| 8,155,237 B2 | 4/2012 | Ahmed | |
| 8,164,384 B2 | 4/2012 | Dawson et al. | |
| 8,174,322 B2 | 5/2012 | Heijden et al. | |
| 8,212,541 B2 | 7/2012 | Perreault et al. | |
| 8,315,578 B2 | 11/2012 | Zhu et al. | |
| 8,340,606 B2 | 12/2012 | Park et al. | |
| 8,416,018 B2 | 4/2013 | Yamauchi et al. | |
| 8,447,245 B2 | 5/2013 | Staudinger et al. | |
| 8,451,053 B2 | 5/2013 | Perreault et al. | |
| 8,472,896 B2 | 6/2013 | Xu et al. | |
| 8,493,142 B2 | 7/2013 | Tadano | |
| 8,536,940 B2 | 9/2013 | Bohn et al. | |
| 8,542,061 B2* | 9/2013 | Levesque | H03F 1/0227 327/536 |
| 8,548,400 B2* | 10/2013 | Traylor | H03G 3/3047 375/308 |
| 8,610,499 B2 | 12/2013 | Royer | |
| 8,611,459 B2 | 12/2013 | McCallister | |
| 8,659,353 B2* | 2/2014 | Dawson | H03F 1/0244 330/124 R |
| 8,718,188 B2 | 5/2014 | Balteanu et al. | |
| 8,773,201 B2 | 7/2014 | Yamamoto et al. | |
| 8,824,978 B2 | 9/2014 | Briffa et al. | |
| 8,829,993 B2 | 9/2014 | Briffa et al. | |
| 8,952,752 B1* | 2/2015 | Huettner | H03F 1/3241 330/124 R |
| 8,988,059 B2 | 3/2015 | Rutkowski | |
| 8,995,502 B1 | 3/2015 | Lai et al. | |
| 9,020,453 B2 | 4/2015 | Briffa et al. | |
| 9,048,727 B2 | 6/2015 | Giuliano et al. | |
| 9,083,294 B2 | 7/2015 | Kermalli | |

(56) References Cited

U.S. PATENT DOCUMENTS

| | | | |
|---|---|---|---|
| 9,141,832 B2* | 9/2015 | Perreault | H03F 1/0294 |
| 9,450,506 B2 | 9/2016 | Perreault et al. | |
| 2003/0001668 A1 | 1/2003 | Mruz et al. | |
| 2003/0146791 A1 | 8/2003 | Shvarts et al. | |
| 2004/0100323 A1 | 5/2004 | Khanifar et al. | |
| 2004/0251964 A1 | 12/2004 | Weldon | |
| 2005/0030104 A1 | 2/2005 | Chen et al. | |
| 2005/0062529 A1 | 3/2005 | Gan et al. | |
| 2005/0110590 A1 | 5/2005 | Korol | |
| 2005/0191975 A1 | 9/2005 | Talwalkar et al. | |
| 2005/0191976 A1 | 9/2005 | Shakeshaft et al. | |
| 2005/0248401 A1 | 11/2005 | Hellberg et al. | |
| 2005/0286278 A1 | 12/2005 | Perreault et al. | |
| 2007/0066224 A1 | 3/2007 | d'Hont et al. | |
| 2007/0066250 A1 | 3/2007 | Takahashi et al. | |
| 2007/0069818 A1 | 3/2007 | Bhatti et al. | |
| 2007/0123184 A1 | 5/2007 | Nesimoglu et al. | |
| 2007/0146090 A1 | 6/2007 | Carey et al. | |
| 2007/0159257 A1 | 7/2007 | Lee et al. | |
| 2007/0247222 A1 | 10/2007 | Sorrells et al. | |
| 2007/0247253 A1 | 10/2007 | Carey et al. | |
| 2007/0281635 A1 | 12/2007 | McCallister et al. | |
| 2007/0290747 A1 | 12/2007 | Traylor et al. | |
| 2007/0291718 A1 | 12/2007 | Chan et al. | |
| 2008/0001660 A1 | 1/2008 | Rasmussen | |
| 2008/0003960 A1 | 1/2008 | Zolfaghari | |
| 2008/0003962 A1 | 1/2008 | Ngai | |
| 2008/0007333 A1 | 1/2008 | Lee et al. | |
| 2008/0012637 A1 | 1/2008 | Aridas et al. | |
| 2008/0019459 A1 | 1/2008 | Chen et al. | |
| 2008/0085684 A1 | 4/2008 | Phillips et al. | |
| 2008/0139140 A1 | 6/2008 | Matero et al. | |
| 2008/0146171 A1 | 6/2008 | Hellberg et al. | |
| 2008/0180171 A1 | 7/2008 | Brobston | |
| 2008/0297246 A1 | 12/2008 | Taylor | |
| 2010/0073084 A1 | 3/2010 | Hur et al. | |
| 2010/0120384 A1 | 5/2010 | Pennec | |
| 2010/0201441 A1 | 8/2010 | Gustavsson | |
| 2011/0135035 A1 | 6/2011 | Bose et al. | |
| 2011/0156815 A1 | 6/2011 | Kim et al. | |
| 2011/0309679 A1 | 12/2011 | Fisher et al. | |
| 2012/0176195 A1 | 7/2012 | Dawson et al. | |
| 2012/0235736 A1 | 9/2012 | Levesque et al. | |
| 2012/0252382 A1 | 10/2012 | Bashir et al. | |
| 2012/0256686 A1 | 10/2012 | Royer | |
| 2012/0313602 A1 | 12/2012 | Perreault et al. | |
| 2012/0326684 A1 | 12/2012 | Perreault et al. | |
| 2013/0241625 A1 | 9/2013 | Perreault et al. | |
| 2013/0251066 A1 | 9/2013 | Kim et al. | |
| 2013/0307618 A1 | 11/2013 | Anvari | |
| 2013/0343106 A1 | 12/2013 | Perreault et al. | |
| 2013/0343107 A1 | 12/2013 | Perreault | |
| 2014/0118063 A1 | 5/2014 | Briffa et al. | |
| 2014/0118065 A1 | 5/2014 | Briffa et al. | |
| 2014/0118072 A1 | 5/2014 | Briffa et al. | |
| 2014/0120854 A1 | 5/2014 | Briffa et al. | |
| 2014/0125412 A1 | 5/2014 | Dawson et al. | |
| 2014/0132354 A1 | 5/2014 | Briffa et al. | |
| 2014/0167513 A1 | 6/2014 | Chang et al. | |
| 2014/0225581 A1 | 8/2014 | Giuliano et al. | |
| 2014/0226378 A1 | 8/2014 | Perreault | |
| 2014/0313781 A1 | 10/2014 | Perreault et al. | |
| 2014/0335805 A1 | 11/2014 | Briffa et al. | |
| 2014/0339918 A1 | 11/2014 | Perreault et al. | |
| 2014/0355322 A1 | 12/2014 | Perreault et al. | |
| 2015/0023063 A1 | 1/2015 | Perreault et al. | |
| 2015/0084701 A1 | 3/2015 | Perreault | |
| 2015/0155895 A1 | 6/2015 | Perreault et al. | |
| 2015/0171768 A1 | 6/2015 | Perreault | |
| 2015/0188448 A1 | 7/2015 | Perreault et al. | |
| 2015/0194940 A1 | 7/2015 | Briffa et al. | |
| 2015/0280553 A1 | 10/2015 | Giuliano et al. | |

FOREIGN PATENT DOCUMENTS

| | | |
|---|---|---|
| EP | 170 366 A3 | 2/2007 |
| EP | 1 609 239 B1 | 7/2010 |
| WO | WO 2005/106613 A1 | 11/2005 |
| WO | WO 2006/119362 A2 | 11/2006 |
| WO | WO 2007/082090 A2 | 7/2007 |
| WO | WO 2007/094921 A1 | 8/2007 |
| WO | WO 2007/136919 A2 | 11/2007 |
| WO | WO 2007/136919 A3 | 11/2007 |
| WO | WO 2009/153218 A1 | 12/2009 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

U.S. Appl. No. 14/975,742, filed Dec. 19, 2015, Perreault et al.
European Extended Search Report dated Jul. 4, 2016; for European Appl. No. 13858970.0; 7 pages.
Godoy et al.: "A 2.5-GHz asymmetric multilevel outphasing power amplifier in 65-nm CMOS"; Massachusetts Institute of Technology, *IEEE* 2011; pp. 57-60 (4 pages).
European Extended Search Report dated Mar. 10, 2016 corresponding to European Application No. 13851200.9; 8 Pages.
Non-Final Office Action dated May 18, 2016; for U.S. Appl. No. 14/934,760, 31 pages.
European Extended Search Report dated May 17, 2016; for European Pat. App. No. 13851838.6, 8 pages.
Nolte of Allowance dated Jul. 7, 2016; for U.S. Appl. No. 14/934,760; 9 pages.
U.S. Appl. No. 14/758,033, filed Jun. 26, 2015, Perreault et al.
U.S. Appl. No. 14/791,685, filed Jul. 6, 2015, Perreault et al.
U.S. Appl. No. 14/837,616, filed Aug. 27, 2015, Briffa, et al.
U.S. Appl. No. 14/823,220, filed Aug. 11, 2015, Barton, et al.
U.S. Appl. No. 14/920,031, filed Oct. 22, 2015, Briffa et al.
U.S. Appl. No. 14/435,914, filed Apr. 15, 2015, Perreault et al.
U.S. Appl. No. 14/934,760, filed Nov. 6, 2015, Briffa et al.
Sungwon Chung, et al., "Asymmetric Multilevel Outphasing Architecture for Multi-Standard Transmitters", 2009 IEEE Radio Frequency Integrated Circuits Symposium, pp. 237-240.
D. Diaz, et al., "Comparison of Two Different Cell Topologies for a Multilevel Power Supply to Achieve High Efficiency Envelope Amplifier", IEEE , 2009, pp. 25-30.
M. Rodriguez, et al., "Multilevel Converter for Envelope Tracking in RF Power Amplifiers", IEEE, 2009, pp. 503-510.
Yuan-Jyue Chen, et al., "Multilevel LINC System Design for Wireless Transmitters", IEEE, 2007, pp. 1-4.
Jinsung Choi, et al., "A ΔΣ-Digitized Polar RF Transmitter", IEEE Transactions on Microwave Theory and Techniques, vol. 55, No. 12, Dec. 2007, pp. 2679-2690.
Kai-Yuan Jheng, et. al., "Multilevel LINC System Design for Power Efficiency Enhancement", IEEE, 2007, pp. 31-34.
Kevin Tom, et al., "Load-Pull Analysis of Outphasing Class-E Power Amplifier", The 2$^{nd}$ International Conference on Wireless Broadband and Ultra Wideband Communications (AusWireless 2007), IEEE, 2007, pp. 1-4.
Surya Musunuri, et al., "Improvement of Light-Load Efficiency Using Width-Switching Scheme for CMOS Transistors", IEEE Power Electronics Letters, vol. 3, No. 3, Sep. 2006, pp. 105-110.
Frederick H. Raab, et al., "RF and Microwave Power Amplifier and Transmitter Technologies—Part 3", Sep. 2003, High Frequency Electronics, Summit Technical Media, LLC., pp. 34-48.

(56) References Cited

OTHER PUBLICATIONS

Petri Eloranta, et al., "A Multimode Transmitter in 0.13 μm CMOS Using Direct-Digital RF Modulator", IEEE Journal of Solid-State Circuits, vol. 42, No. 12, Dec. 2007, pp. 2774-2784.
Invitation to Pay Additional Fees in PCT/US2009/063821 dated Feb. 9, 2010.
PCT Search Report of the ISA dated Apr. 13, 2010.
PCT Written Opinion of the ISA dated Apr. 13, 2010.
International Preliminary Report on Patentability of the ISA for PCT/US2009/063821 dated May 26, 2011.
Amendment to Office Action mailed Apr. 7, 2011 (U.S. Appl. No. 12/680,048, filed Mar. 25, 2010).
Response to Rule 161 communication dated Jun. 28, 2011; Jan. 9, 2012.
U.S. Appl. No. 12/615,696, filed Nov. 10, 2009; 427 pages.
U.S. Appl. No. 13/106,195, filed May 12, 2011; Part 1 of 2, 291 pages.
U.S. Appl. No. 13/106,195, filed May 12, 2011; Part 2 of 2, 238 pages.
U.S. Appl. No. 13/423,909, filed Mar. 19, 2012; Part 1 of 3, 300 pages.
U.S. Appl. No. 13/423,909, filed Mar. 19, 2012; Part 2 of 3, 360 pages.
U.S. Appl. No. 13/423,909, filed Mar. 19, 2012; Part 3 of 3, 397 pages.
Beltran, et al.; "HF Outphasing Transmitter Using Class-E Power Amplifiers;" Microwave Symposium Digest, IEEE; Jun. 2009; pp. 757-760.
Bifrane, et al.; "On the Linearity and Efficiency of Outphasing Microwave Amplifiers;" IEEE Transactions on Microwave Theory and Techniques; vol. 52; No. 7; Jul. 2004; pp. 1702-1708.
Chen, et al.; "A High Efficiency Outphasing Transmitter Structure for Wireless Communications;" Digital Signal Processing Workshop, IEEE; Jan. 2009, pp. 348-352.
Chireix; "High Power Outphasing Modulation;" Proceedings of the Institute of Radio Engineers; vol. 23; No. 11; Nov. 1935; pp. 1370-1392.
Cox; "Linear Amplification with Nonlinear Components;" IEEE Transactions on Communications; Dec. 1974; pp. 1942-1945.
El-Hamamsy; "Design of High-Efficiency RF Class-D Power Amplifier;" IEEE Transactions on Power Electronics; vol. 9; No. 3; May 1994; pp. 297-308.
Eun, et al.; "A High Linearity Chireix Outphasing Power Amplifier Using Composite Right/Left-Handed Transmission Lines;" Proceedings of the 37$^{th}$ European Microwave Conference; Oct. 2007; pp. 1622-1625.
Everitt, et al.; "*Communications Engineering*;" 3$^{rd}$ Edition, Chapter 11, pp. 403-450, New York: McGraw-Hill, 1956.
Gerhard, et al.; "Improved Design of Outphasing Power Amplifier Combiners;" 2009 German Microwave Conference; Mar. 2009; pp. 1-4.
Godoy, et al.; "Outphasing Energy Recovery Amplifier With Resistance Compression for Improved Efficiency;" IEEE Transactions on Microwave Theory and Techniques; vol. 57; No. 12; Dec. 2009; pp. 2895-2906.
Hakala, et al., "A 2.14-GHz Chireix Outphasing Transmitter;" IEEE Transactions on Microwave Theory and Techniques; vol. 53; No. 6; Jun. 2005; pp. 2129-2138.
Hakala, et al.; Chireix Power Combining with Saturated Class-B Power Amplifiers; 12$^{th}$ GAAS Symposium; Oct. 2004, pp. 379-382.
Hamill; "Impedance Plan Analysis of Class DE Amplifier;" Electronics Letters; vol. 30; No. 23; Nov. 10, 1994; pp. 1905-1906.
Hamill; "Time Reversal Duality Between Linear Networks;" IEEE Transactions on Circuits and Systems-I: Fundamental Theory and Applications; vol. 43; No. 1; Jan. 1996; pp. 63-65.
Hamill; "Time Reversal Duality in Dc-Dc Converters;" Power Electronics Specialists Conference, IEEE; vol. 1; Jun. 1997; 7 pages.

Han, et al.; "Analysis and Design of High Efficiency Matching Networks;" IEEE Transactions on Power Electronics; vol. 21; No. 5, Sep. 2006; pp. 1484-1491.
Han, et al.; "Resistance Compression Networks for Radio-Frequency Power Conversion;" IEEE Transactions on Power Electronics; vol. 22; No. 1; Jan. 2007; pp. 41-53.
Honjo; "A Simple Circuit Synthesis Method for Microwave Class-F Ultra-High-Efficiency Amplifiers with Reactance-Compensation Circuits;" Solid-State Electronics 44; Feb. 2000; pp. 1477-1482.
Hur, et al.; "A Multi-Level and Multi-Band Class-D CMOS Power Amplifier for the LINC System in the Cognitive Radio Application;" IEEE Microwave and Wireless Components Letters; vol. 20; Issue 6; Jun. 2010; pp. 1-3.
Hur, et al.; "Highly Efficient and Linear Level Shifting Digital LINC Transmitter with a Phase Offset Cancellation;" Radio & Wireless Symposium; Jan. 2009; pp. 211-214.
Hur, et al.; "Highly Efficient Uneven Multi-Level LINC Transmitter;" Electronics Letters; Jul. 30, 2009; vol. 45; No. 16; 2 pages.
Kee, et al.; "The Class-E/F Family of ZVS Switching Amplifiers;" IEEE Transactions on Microwave Theory and Techniques; vol. 51; No. 6; Jun. 2003; pp. 1677-1690.
Kruass, et al.; *Solid State Radio Engineering*; Chapter 14, New York: Wiley, 1980.
Langridge, et al.; "A Power Re-Use Technique for Improved Efficiency of Outphasing Microwave Power Amplifiers;" IEEE Transactions on Microwave Theory and Techniques; vol. 47; No. 8; Aug. 1999; pp. 1467-1470.
Lee; "*Planar Microwave Engineering*;" Chapter 20, pp. 630-687, New York: Cambridge University Press, 2004.
Lepine, et al.; "L-Band LDMOS Power Amplifiers Based on an Inverse Class-F Architecture;" IEEE Transactions on Microwave Theory and Techniques; vol. 53; No. 6; Jun. 2005; pp. 2007-2012.
Ni, et al.; "A New Impedance Match Method in Serial Chireix Combiner;" 2008 Asia-Pacific Microwave Conference; Dec. 2008; pp. 1-4.
Perreault; A New Power Combining and Outphasing Modulation System for High-Efficiency Power Amplification; Circuits and Systems (MWSCAS), 53$^{rd}$ IEEE, International Midwest Symposium; Aug. 2010; pp. 1-14.
Phinney, et al.; "Radio-Frequency Inverters with Transmission-Line Input Networks;" IEEE Transactions on Power Electronics; vol. 22; No. 4; Jul. 2007; pp. 1154-1161.
Qureshi, et al.; "A 90-W Peak Power GaN Outphasing Amplifier with Optimum Input Signal Conditioning;" IEEE Transactions on Microwave Theory and Techniques; vol. 57; No. 8; Aug. 2009; pp. 1925-1935.
Raab; "Class-F Power Amplifiers with Maximally Flat Waveforms;" IEEE Transactions on Microwave Theory and Techniques; vol. 45; No. 11; Nov. 1997; pp. 2007-2012.
Raab; "Efficiency of Outphasing RF Power-Amplifier Systems;" IEEE Transactions on Communications; vol. Com-33; No. 10; Oct. 1985; pp. 1094-1099.
Raab, et al.; "RF and Microwave Power Amplifier and Transmitter Technologies—Part 3;" High Frequency Electronics; Sep. 2003; pp. 34-48.
Rivas, et al.; "A High-Frequency Resonant Inverter Topology with Low-Voltage Stress;" IEEE Transactions on Power Electronics; vol. 23; No. 4; Jul. 2008; pp. 1759-1771.
Sokal, et al.; "Class E-A New Class of High-Efficiency Tuned Single-Ended Switching Power Amplifiers;" IEEE Journal of Solid-State Circuits; vol. SC-10; No. 3; Jun. 1975; pp. 168-176.
Sokal; "Class-E RF Power Amplifiers;" QEX; Jan./Feb. 2001; pp. 9-20.
Yao, et al.; "Power Amplifier Selection for LINC Applications;" IEEE Transactions on Circuits and Systems-II: Express Briefs; vol. 53; No. 8; Aug. 2006; pp. 763-767.
Zhang, et al.; "Analysis of Power Recycling Techniques for RF and Microwave Outphasing Power Amplifiers;" IEEE Transactions on Circuits and Systems-II: Analog and Digital Signal Processing; vol. 49; No. 5; May 2002; pp. 312-320.
Zhou, et al.; "A Distributed Active Transformer Coupled Outphasing Power Combiner;" IEEE Microwave Conference; Dec. 2009; pp. 2565-2568.

(56) References Cited

OTHER PUBLICATIONS

Zhukov, et al.; "Push-pull switching oscillator without commutating losses;" Poluprovodnikovye Pribory v. Tekhnike Elektrosvyazi, No. 15, Jan. 1975, 8 pages.
Xu, et al.; "A 28.1dBm class-D outphasing power amplifier in 45nm LP digital CMOS;" Symposium on VLSI Circuits Digest of Technical Papers; Jun. 16, 2009; pp. 206-207.
Zhou, et al.; "A Distributed Active Transformer Coupled Outphasing Power Combiner;" Microwave Conference, IEEE; Dec. 7, 2009; pp. 2565-2568.
PCT Search Report of the ISA for PCT/US2011/023613 May 30, 2011.
PCT Written Opinion of the ISA for PCT/US2011/023613 dated May 30, 2011.
International Preliminary Report on Patentability of the ISA for PCT/US2011/023613 dated Aug. 16, 2012.
U.S. Appl. No. 13/020,568, filed Feb. 3, 2011; part 1 of 2, 335 pages.
U.S. Appl. No. 13/020,568, filed Feb. 3, 2011; part 2 of 3, 100 pages.
U.S. Appl. No. 13/020,568, filed Feb. 3, 2011; part 3 of 3, 244 pages.
Cripps; "RF Power Amplifier for Wireless Communications, $2^{nd}$ Ed.;" Chapter 14, Artech House, Boston, MA; Jan. 2006.
Godoy, et al.; "A 2.4-GHz, 27-dBm Aysmmetric Multilevel Outphasing Power Amplifier in 65-nm CMOS;" IEEE Journal of Solid-State Circuits; vol. 47; No. 10; Oct. 2012; pp. 2372-2384.
Raab; "Average Efficiency of Class-G Power Amplifiers;" IEEE Transactions on Consumer Electronics; vol. CE-32; No. 2; May 1986; pp. 145-150.
Shirvani, et al.; "A CMOS RF Power Amplifier With Parallel Amplification for Efficient Power Control;" IEEE Journal of Solid-State Circuits; vol. 37; No. 6; Jun. 2002; pp. 684-693.
Vasic, et al.: "Multilevel Power Supply for High Efficiency RF Amplifiers;" 2009 IEEE Applied Power Electronics Conference; pp. 1233-1238; Feb. 2009.
Walling, et al.; "A Class-G Supply Modulator and Class-E PA in 130 nm CMOS;" IEEE Journal of Solid-State Circuits; vol. 44; No. 9; Sep. 2009; pp. 2339-2347.
Yan, et al.; "A High Efficiency 780 MHz GaN Envelope Tracking Power Amplifier;" 2012 Compound Semiconductor Integrated Circuits Syumposium; Oct. 2012; pp. 1-4.
Yousefzadeh, et al.; "Three-Level Buck Converter for Envelope Tracking Applications;" IEEE Transactions on Power Electronics; vol. 21; No. 2; Mar. 2006; pp. 549-552.
Heijden, et al.; "A 19W High-Efficiency Wide-Band CMOS-GeN Class-E Chireix RF Outphasing Power Amplifier" Microwave Symposium Digest (MMT), 2011 IEEE MTT-S International; Jun. 5-10, 2011; 4 pages.
PCT Search Report of the ISA for PCT/US2013/065552 dated Mar. 20, 2014.
Written Opinion of the ISA for PCT/US2013/065552 dated Mar. 20, 2014.
PCT Search Report of the ISA for PCT/US2013/065553 dated Mar. 20, 2014.
Written Opinion of the ISA for PCT/US2013/065553 dated Mar. 20, 2014.
Notice of Allowance for U.S. Appl. No. 13/663,887, filed Oct. 30, 2012.
PCT Search Report of the ISA for PCT/US2013/70027 dated Apr. 22, 2014.
PCT Written Opinion of the ISA for PCT/US2013/70027 dated Apr. 22, 2014.
Heijden, et al.; "A 19W High-Efficiency Wide-Band CMOS-GaN Class-E Chireix RF Outphasing Power Amplifier" Microwave Symposium Digest (MMT), 2011 IEEE MTT-S International; Jun. 5-10, 2011; 4 pages.
U.S. Appl. No. 13/663,878; 200 Pages.
U.S. Appl. No. 13/663,878; 134 Pages.
U.S. Appl. No. 13/663,887; 259 Pages.
U.S. Appl. No. 14/338,671; 269 Pages.
U.S. Appl. No. 14/666,965; 175 Pages.
U.S. Appl. No. 13/666,965; 161 Pages.
U.S. Appl. No. 13/833,050; 150 Pages.
U.S. Appl. No. 13/833,050; 124 Pages.
U.S. Appl. No. 14/064,572; 150 Pages.
U.S. Appl. No. 14/064,572; 142 Pages.
U.S. Appl. No. 13/955,952; 205 Pages.
U.S. Appl. No. 13/955,952; 204 Pages.
Office Action dated May 23, 2014 from U.S. Appl. No. 13/663,878, filed Oct. 30, 2012; 20 Pages.
Response to Office Action dated May 23, 2014 as filed on Jul. 31, 2014 from U.S. Appl. No. 13/663,878, filed Oct. 30, 2012; 7 Pages.
Office Action dated Oct. 29, 2014 for U.S. Appl. No. 13/663,878, filed Oct. 30, 2012; 15 Pages.
Response filed Dec. 30, 2014 of Office Action dated Oct. 29, 2014 for U.S. Appl. No. 13/663,878, filed Oct. 30, 2012; 20 Pages.
Office Action dated Jan. 26, 2015 for U.S. Appl. No. 13/955,952, filed Jul. 31, 2013; 30 Pages.
Office Action dated Feb. 23, 2015; for U.S. Appl. No. 14/064,572, filed Oct. 28, 2013; 29 Pages.
Notice of Allowance dated Jul. 14, 2014 for U.S. Appl. No. 13/833,050, filed Mar. 15, 2013; 23 Pages.
Response filed Mar. 10, 2015 of Office Action dated Feb. 23, 2015 for U.S. Appl. No. 14/064,572, filed Oct. 28, 2013; 3 Pages.
Office Action dated Apr. 24, 2015 for U.S. Appl. No. 14/064,572; 10 Pages.
Office Action dated May 7, 2015 for U.S. Appl. No. 13/663,878, filed Oct. 30, 2012; 23 Pages.
PCT International Preliminary Report on Patentability dated May 14, 2015 for Intl. Application No. PCT/US2013/06552; 13 Pages.
PCT International Preliminary Report on Patentability dated May 14, 2015 for Intl. Application No. PCT/US2013/06553; 13 Pages.
Response to Office Action dated Feb. 23, 2015 for U.S. Appl. No. 14/064,572; Response filed Mar. 10, 2015; 3 Pages.
Response to Office Acton dated Jan. 26, 2015 for U.S. Appl. No. 13/955,952; Response filed on May 26, 2015; 11 Pages.
Office Action dated Jun. 2, 2015 for U.S. Appl. No. 13/663,878; 18 Pages.
Office Action dated Jul. 8, 2015 for U.S. Appl. No. 13/955,952; 13 Pages.
PCT International Preliminary Report on Patentability dated Jun. 2, 2015 for Intl. Application No. PCT/US2013/070027; 12 Pages.
Response to Office Action dated Apr. 24, 2015 for U.S. Appl. No. 14/064,572; Response filed on Jul. 17, 2015; 9 Pages.
Response to Final Office Action dated Jun. 2, 2915 for U.S. Appl. No. 13/663,878; Response filed on Jul. 21, 2015; 13 Pages.
Notice of Allowance dated Aug. 3, 2015 for U.S. Appl. No. 14/064,572; 13 Pages.
Notice of Allowance dated Jul. 29, 2015 for U.S. Appl. No. 13/955,952; 11 Pages.
Notice of Allowance dated Aug. 13, 2015 for U.S. Appl. No. 13/663,878; 13 Pages.
Office Action dated May 21, 2015 for U.S. Appl. No. 14/666,965; 15 Pages.
Response to Office Action dated May 21, 2015 corresponding U.S. Appl. No. 14/666,965; Response filed on Jul. 23, 2015; 12 Pages.
Supplemental Response to Office Action dated May 21, 2015 corresponding to U.S. Appl. No. 14/666,965; Supplemental Response filed on Aug. 10, 2015; 9 Pages.
Notice of Allowance dated Aug. 25, 2015 corresponding to U.S. Appl. No. 14/666,965; 16 Pages.
U.S. Appl. No. 15/149,491, filed May 9, 2016, Perreault, et al.
Response filed on Jun. 3, 2016 to Non-Final Office Action dated May 18, 2016; U.S. Appl. No. 14/934,760; 10 pages.
U.S. Appl. No. 15/287,068, filed Oct. 6, 2016, Briffa, et al.
U.S. Appl. No. 15/354,170, filed Nov. 17, 2016, Briffa, et al.
Japanese Voluntary Amendment and Request for Examination (with English amended claims) filed Nov. 2, 2016; for Japanese Pat. App. 2015-544088; 17 pages.
Japanese Voluntary Amendment and Request for Examination (with English amended claims) filed Oct. 4, 2016; for Japanese Pat. App. 2015-539670; 19 pages.
Japanese Voluntary Amendment and Request for Examination (with English amended claims) filed Oct. 4, 2016; for Japanese Pat. App. 2015-539669; 19 pages.

(56) References Cited

OTHER PUBLICATIONS

Notice Of Allowance dated Dec. 1, 2016 for European Patent Application No. 13/851,200.9; 60 Pages.
Response to Communication dated Dec. 5, 2016 with amended claims for European Patent Application No. 13/851,838.6; 7 Pages.
Response filed on Dec. 6, 2016 to Non-Final Office Action dated Sep. 15, 2016; for U.S. Appl. No. 14/837,616; 3 pages.
Communication pursuant to Article 94(3) EPC dated Jan. 5, 2017 for European Patent Application No. 13 851 838.6; 4 Pages.
Response to the Jul. 21, 2016 communication pursuant to Rules 72(2) and 70a(e) EPC from European Application No. 13858970.0 as filed on Jan. 31, 2017; 5 Pages.
Non-Final Office Action date Sep. 15, 2016; for U.S. Appl. No. 14/837,616, 17 pages.
Response filed on Sep. 30, 2016 to the Official Communication of Mar. 31, 2016; for European Pat. App. No. 13851200.9; 4 pages.
Notice of Allowance dated Aug. 24, 2016; for U.S. Appl. No. 14/920,031; 29 pages.
U.S. Appl. No. 15/290,402, filed Oct. 11, 2016, Perreault, et al.
Office Action dated Feb. 27, 2017 from U.S. Appl. No. 15/354,170; 28 Pages.
Office Action dated Mar. 2, 2017 from U.S. Appl. No. 14/837,616; 13 Pages.
Response to Office Action dated Feb. 22, 2017 from U.S. Appl. No. 15/287,068, filed May 16, 2017; 8 Pages.
Response to Office Action dated Feb. 27, 2017 from U.S. Appl. No. 15/354,170, filed May 22, 2017; 7 Pages.
Response to Office Action dated Mar. 2, 2017 from U.S. Appl. No. 14/837,616, filed Jun. 1, 2017; 9 Pages.
Office Action dated Feb. 22, 2017 from U.S. Appl. No. 15/287,068; 43 Pages.

\* cited by examiner

LINEARITY AND NOISE IMPROVEMENT FOR MULTILEVEL POWER AMPLIFIER SYSTEMS USING MULTI-PULSE DRAIN TRANSITIONS

CROSS-REFERENCE TO RELATED APPLICATIONS

This application claims the benefit under 35 U.S.C. §119 (e) of U.S. provisional application No. 62/091,730, filed on Dec. 15, 2014, which is hereby incorporated herein by reference in its entirety.

This application is a continuation-in-part, and claims the benefit under 35 U.S.C. §120, of U.S. patent application Ser. No. 14/934,760 filed Nov. 6, 2015, which is a continuation of U.S. patent application Ser. No. 14/666,965 filed Mar. 24, 2015, now issued as U.S. Pat. No. 9,209,758, which is a continuation of U.S. patent application Ser. No. 14/338,671 filed Jul. 23, 2014, now issued as U.S. Pat. No. 9,020,453, which are hereby incorporated herein by reference in their entireties.

BACKGROUND

As is known in the art, achieving both high efficiency and high linearity of radio frequency (RF) power amplifier (PA) systems is a longstanding challenge. One means of improving efficiency in such systems is to utilize an architecture in which the PA system is switched with discrete transitions among a set of operating states (e.g., a set of drain bias voltages for one or more power amplifiers in the PA system). This includes systems where the drain voltage of at least one power amplifier is selected (e.g., via switches) from among multiple discrete supply voltages. Discrete output states can also be realized through systems in which the drain voltage is derived from a direct current (DC) voltage source, such as a DC-DC converter that has a plurality of preferred discrete output voltage levels (with the converter output network and/or a filter optionally providing for shaping of transitions between those preferred levels). Other means of synthesizing a set of discrete output levels can likewise be realized.

The nature of the drain voltage transitions in such systems can be important to the RF output quality that is achieved. In particular, the power amplifiers respond to both changes in the RF (gate) input and their DC bias (drain) input.

As is also known, high frequency (e.g., RF) signal components can occur due to changes in a drain voltage and such signal components can be "mixed" (e.g., cross-coupled) with the RF input, yielding undesirable switching signal components in the RF output spectrum around the carrier frequency. However, it is difficult to compensate for such high-frequency drain voltage components via controlling the RF inputs to the PA system. Such undesired components in the RF output might lead to leakage into adjacent channels thereby reducing "linearity" through worsening of "Adjacent Channel Leakage Ratio" (ACLR). Moreover, such undesired components in the RF output can appear in the receive band, contributing to receive-band noise and reducing receiver performance.

Designing multilevel power amplifier systems to mitigate these unwanted spectral components is a challenging task that imposes significant design constraints (e.g., on the range of conditions for which a particular system can operate well.) It is particularly challenging to design such systems to operate well across a wide range of bandwidths and/or in different bands (e.g., with different receive-band spacing and placement) and/or for both time-division duplexing (TDD) and frequency-division duplexing (FDD).

SUMMARY

Described embodiments are generally directed toward a radio frequency (RF) amplifier system having at least one amplifier. The at least one amplifier includes an RF input port, an RF output port and a drain bias port. At least one voltage modulator is coupled to the bias port of the least one amplifier to provide a bias voltage. The bias voltage is selected by switching among a plurality of discrete voltages. At least one filter circuit is coupled between the at least one voltage modulator and the at least one amplifier. The at least one filter circuit controls spectral components resultant from transitions in the bias voltage when switching among the plurality of discrete voltages. A controller dynamically adapts at least one setting of the at least one voltage modulator by using multi-pulse transitions when switching among the plurality of discrete voltages for a first operating condition of the RF amplifier.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

The concepts, circuits, systems and techniques described herein reduce or suppress (ideally eliminate) undesired output signal components in multilevel radio frequency (RF) amplifier systems, and in particular in multilevel RF power amplifier (PA) systems. Embodiments using such concepts, circuits, systems and techniques might have, for example, improved linearity and reduced undesired RF output components (or "noise") as well as receive-band noise. Described embodiments provide improved shaping of spectral components resulting from voltage transitions that might be introduced, for example, at the drain voltage of power amplifiers (PAs) of the RF system. For example, PA systems might desirably transition among one or more discrete states (e.g., discrete voltage states at which the PAs operate to provide a given output signal) for some operating conditions. Illustrative PA systems are described in U.S. Pat. No. 8,829,993, U.S. Pat. No. 9,020,453, and U.S. Pat. No. 8,824,978, all owned by the assignee of the present application, and which are hereby incorporated herein by reference in their entireties.

Additionally or alternatively, PA systems might provide continuous envelope tracking or adaptive power tracking for other conditions. This might be accomplished by (1) switching a drain bias signal from one of a set of discrete supplies to an input that provides continuous envelope tracking, (2) changing from a mode where one voltage is selected from among individual levels to a mode that rapidly pulse-width modulates (PWM) among the voltage levels to provide a continuously variable output for envelope tracking, or (3) adapting the set of discrete drain bias voltages over time. PA systems that adapt discrete drain bias voltages over time are described in U.S. patent application Ser. No. 14/035,445 filed on Sep. 24, 2013, Ser. No. 14/619,737 filed Feb. 11, 2015, Ser. No. 14/837,616 filed Aug. 27, 2015, and Ser. No. 14/255,427 filed Apr. 17, 2014, all owned by the assignee of the present application, and which are hereby incorporated herein by reference in their entireties.

The concepts, circuits, systems and techniques described herein might commonly be employed, for example, in "class G" amplifiers, a Multi-level Linear amplifier with Nonlinear Components (MLINC), Asymmetric Multilevel Outphasing (AMO) amplifiers, and multilevel backoff amplifiers including Asymmetric Multilevel BackOff (AMBO) amplifiers.

Described embodiments achieve a high degree of linearity and low noise during operating state switching of the power amplifier (PA), and provide flexibility to address a wide variety of different operating conditions (e.g., different bandwidths, transmission bands, etc.) that impose different requirements on drain bias voltage transitions.

Figure 1:
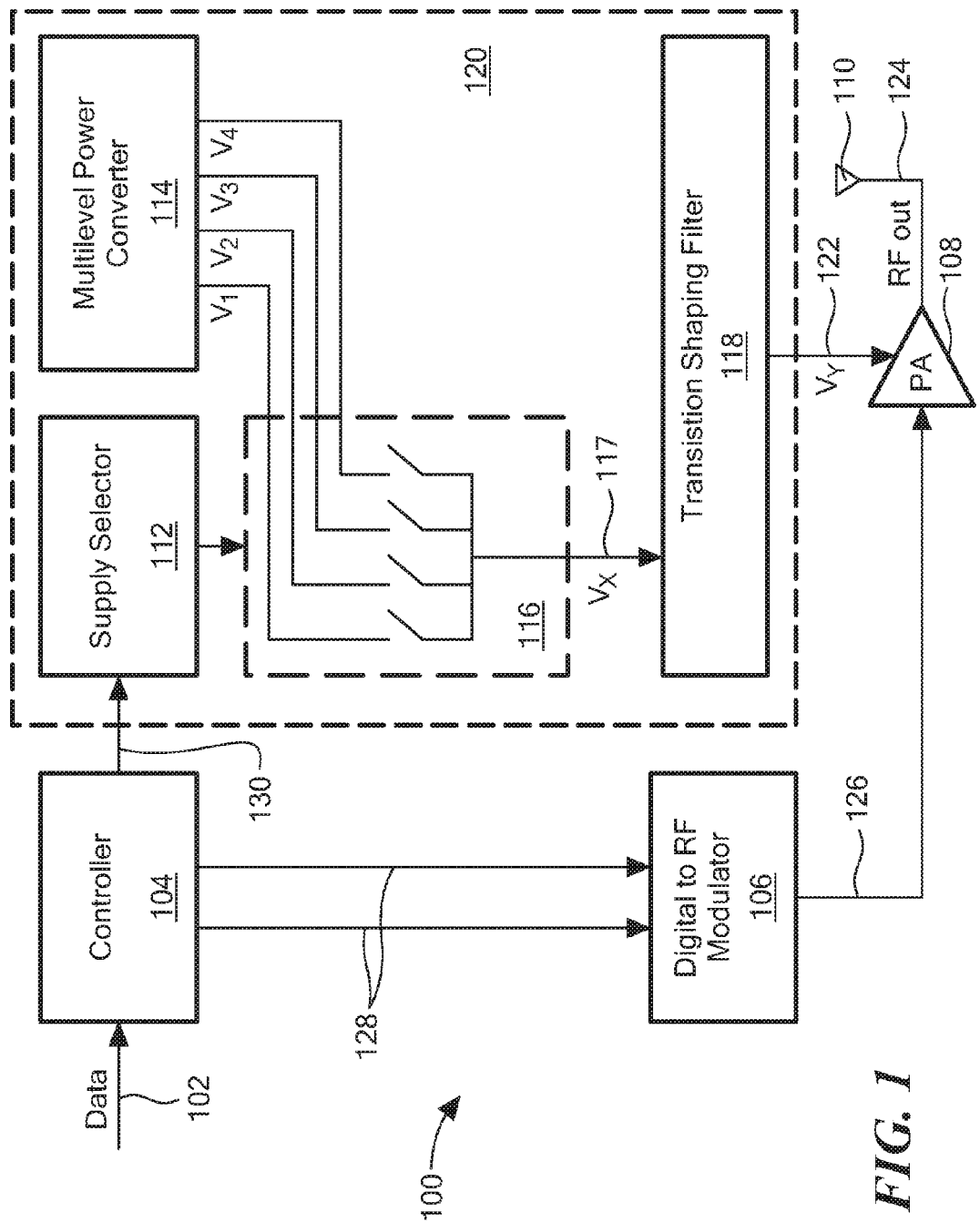
FIG. 1 is a block diagram of a multilevel radio frequency (RF) power amplifier (PA) system in accordance with illustrative embodiments.

Referring now to FIG. 1, illustrative PA system 100 includes one or more RF amplifiers, shown here as power amplifier (PA) 108 that receives a drain bias signal 122 that is dynamically selected from among a number of discrete signal levels, shown here as $V_1$-$V_4$. Transition shaping filter 118 controls (e.g., smooths or otherwise shapes via filtering) the transitions between the levels as will be described below. PA system 100 further includes controller 104 that processes data 102 for transmission by the PA system. Controller 104 processes data 102 and provides data and control signals 128 to digital-to-RF modulator 106 and control signals 130 to supply modulator (or drain bias circuit) 120. In response to signals provided from controller 104, digital-to-RF modulator 106 provides a modulated RF signal 126 to PA 108, which amplifies the signal provided thereto and provides an amplified RF signal 124 to antenna 110 for transmission. Illustrative PA system 100 might be employed in an RF receiver, transmitter or transceiver circuit, for example in a wireless communication system.

Controller 104 determines the drain bias voltage (e.g., drain bias signal 122) to be provided to PA 108. Controller 104 is also coupled to supply modulator 120. In response to signals provided from controller 104, supply modulator 120 provides a bias signal 122 having a determined voltage level to PA 108. In some embodiments, the supply modulator might optionally include supply selector 112 that actuates commands provided thereto from controller 104 (e.g., supply selector 112 might decode signals sent by controller 104). In other embodiments, controller 104 might provide control signals 130 directly to switches 116.

Regardless of particular manner in which controller 104 is coupled to supply modulator 120, bias signal 122 might be dynamically switched (e.g., modulated) among different power supply levels (e.g., voltage levels) based, at least in part, on characteristics of a signal to be transmitted (e.g., desired characteristics of RF output signal 124 to be transmitted via antenna 110). Bias signal 122 might be a selected one of a plurality of fixed supply voltages, for example supply voltages $V_1$, $V_2$, $V_3$, and $V_4$ generated by multilevel power converter 114, and selected by switches 116 based on control signals from controller 104. Alternatively, bias signal 122 might be dynamically varied (e.g., if multilevel power converter 114 is a variable output supply). Similarly, the supply voltages $V_1$, $V_2$, $V_3$, and $V_4$ shown in FIG. 1 might be themselves dynamically varied. Thus, the supply voltage applied to PA 108 might be varied based on characteristics of the signal to be transmitted, for example, a desired average power level during a particular time period.

In some embodiments, the switched power supply levels might be directly applied to PA 108 (e.g., as bias signal 122), or might be coupled to PA 108 through transition shaping filter 118, which filters or otherwise removes undesired switching signal characteristics (e.g., sharp transition edges or other switching noise) to provide acceptable transitions among the power supply levels.

For example, sharp transition edges or other noise present on the power supply input to the power amplifier (collectively referred to as switching noise) might be coupled into the RF output of the power amplifier (e.g., into RF output signal 124).

Filter 118 might be provided as a passive filter (including passive components such as resistors, inductors and capacitors), an active filter (including active components such as transistors, transistor switches, switches and amplifiers), or a hybrid filter (including a combination of passive and active components). It should be appreciated that, for some applications, system 100 might be implemented in a single integrated circuit (IC).

Figure 2:
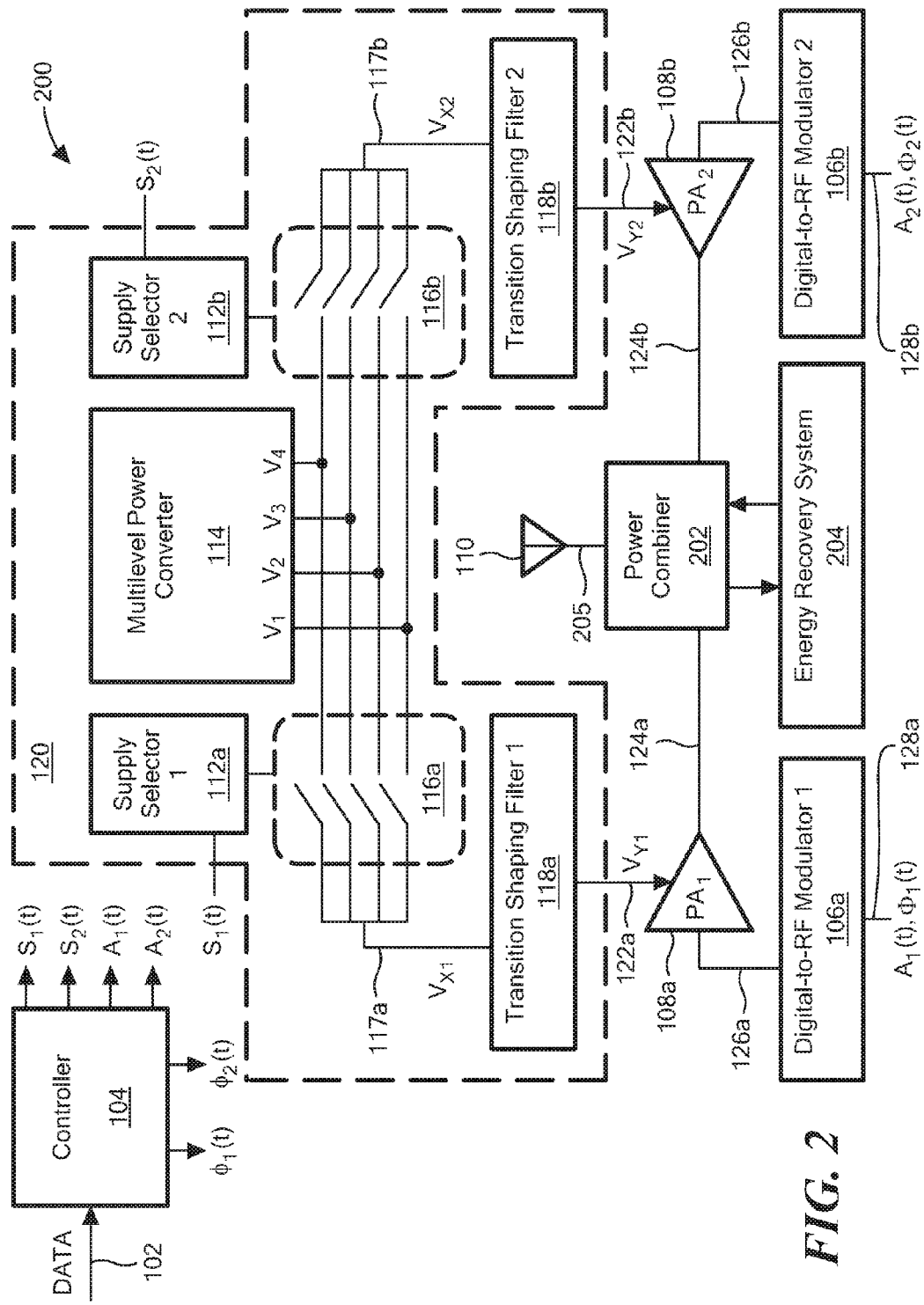
FIG. 2 is a block diagram of a multilevel RF PA system in accordance with illustrative embodiments.

Referring now to FIG. 2, illustrative PA system 200 includes a pair of RF amplifiers 108a and 108b (here illustrated as power amplifiers), which each receive a bias signal 122a and 122b from supply modulator (or drain bias circuit) 120. Supply modulator 120 provides bias signals 122a and 122b having values (e.g., voltage levels) dynamically selected depending upon one or more characteristics of the signal to be transmitted. As shown in FIG. 2, power supply levels are provided to multiple PAs, shown in FIG. 2 as PA1 108a and PA2 108b.

It should be appreciated that although illustrative system 200 is shown as having two amplifiers 108a and 108b, any number of amplifiers (e.g., PAs) might be employed. The power supply levels might be independently modulated (e.g., by switches 116 based on control signals from controller 104) among different bias levels (e.g., drain voltage levels, for example voltages $V_1, V_2, V_3, V_4$), which might be fixed or variable over time.

Likewise, the transitions among the different voltage levels $V_1, V_2, V_3, V_4$ might be shaped by transition shaping filters 118a and 118b to provide improved radio frequency (RF) output characteristics of PAs 108. For example, by reducing (or ideally, removing) switching noise (including undesired switching signal components of the transitions, noise from parasitics excited by switching or other noise from the power converter, etc.) from the power supply input and, thus, preventing switching noise from being coupled to the RF output(s) (e.g., 124a and 124b) of the PA. The characteristics of filters 118a and 118b are thus selected to reduce, and ideally prevent, switching noise from being introduced to the RF transmit signal path (e.g., RF output signal 124) via respective bias terminals of amplifiers 108a and 108b. It is desired that the filters have a passband that is wide enough (in frequency) to accommodate sufficiently rapid drain bias changes for the PAs to efficiently transmit the desired output signal at the needed bandwidth, but provide sufficient attenuation at higher frequencies such that components in the filtered drain bias signal will not cause out-of-band interference (e.g., in the receive band). In many embodiments, it is desired to have a response that is also fast (responding quickly to a level change) but reasonably well damped.

It should be appreciated that although each amplifier 108a and 108b are shown in FIG. 2 as having unique corresponding elements (e.g., supply selector 112a, switches 116a, transition shaping filter 118a and modulator 128a for PA 108a, and supply selector 112b, switches 116b, transition shaping filter 118b and modulator 128b for PA 108b), systems might employ one or more common elements among the PAs 108.

As also shown in FIG. 2, the outputs of amplifiers 108a and 108b are combined by power combiner 202 to provide a single RF output to antenna 110. In some embodiments, power combiner 202 might be an isolating power combiner or an isolating power combiner with an energy recovery system (e.g., 204) coupled to the isolation port of the power combiner. The energy recovery module 204 might operate such as described in U.S. Pat. No. 8,830,710 assigned to the assignee of the present application and which is hereby incorporated herein by reference in its entirety. Alternatively, power combiner 202 might be a non-isolating combiner, such as a Doherty combiner, a Chireix combiner, or with another combiner comprising combinations of transmission line(s) and/or energy storage element(s). Thus, power combiner 202 generates a single high-power output for transmission by antenna 110 based on the output of amplifiers 108a and 108b.

In other embodiments, amplifiers 108a and 108b might support separate RF outputs (e.g., for a MIMO system or for a balanced power amplifier system utilizing multiple PAs), for example with each amplifier 108a and 108b feeding a separate antenna 110 versus being combined into a single output via power combiner 202. In other embodiments, one subset of amplifiers might serve as a driver stage for another subset of amplifiers.

Multilevel power converter 114 might be powered from a single input, with the power supply voltages generated in a variety of ways, for example, by employing a multi-output switched-capacitor power supply or a hybrid magnetic-switched-capacitor power supply such as described in U.S. patent application Ser. No. 14/035,445 filed on Sep. 24, 2013 assigned to the assignee of the present application and which is hereby incorporated herein in its entirety. Other embodiments might employ a multi-output magnetic converter (e.g., with multiple tapped inductors or multi-winding transformers or using a single inductor multiple output (SIMO) configuration), or employ individual power supplies to synthesize each of $V_1, V_2, V_3$ and $V_4$ from the single input. Likewise, one or more of the power supply levels might be taken from convenient voltages already available for other components in a given system. It will be appreciated that while four supply levels $V_1, V_2, V_3$ and $V_4$ are shown in FIG. 2, any desirable number of supply levels might be employed.

As shown in FIG. 2, controller 104 generates control signals $S_1(t)$ and $S_2(t)$ for respective supply selectors 112a and 112b. Control signals $S_1(t)$ and $S_2(t)$ are provided to supply modulator 120 and employed by supply selectors 112a and 112b, respectively, to configure switches 116a and 116b that modulate the power supply voltage provided to a corresponding one of PAs 108a and 108b. Control signals $S_1(t)$ and $S_2(t)$ vary over time based on data 102 input to controller 104.

Controller 104 also generates control signals $A_1(t), \phi_1(t), A_2(t)$ and $\phi_2(t)$ for respective digital-to-RF modulators 106a and 106b. Control signals $A_1(t)$ and $A_2(t)$ are employed by digital-to-RF modulator 106a and 106b, respectively, to determine an amplitude of the output of the corresponding one of digital-to-RF modulators 106a and 106b. Control signals $\phi_1(t)$ and $\phi_2(t)$ are employed by digital-to-RF modulator 106a and 106b, respectively, to determine a phase of the output of the corresponding one of digital-to-RF modulator 106a and 106b. Control signals $A_1(t), \phi_1(t), A_2(t)$ and $\phi_2(t)$ can vary over time based on data 102 input to controller 104. It will be appreciated that information denoted by signals $A_1(t), \phi_1(t), A_2(t)$ and $\phi_2(t)$ might be provided in any format that contains the information, including, for example, In-phase (I) and Quadrature (Q) signals, such as $I_1(t), Q_1(t), I_2(t)$ and $Q_2(t)$.

Digital-to-RF modulators 106a and 106b modulate one or more local carriers based on information from control signals $A_1(t), \phi_1(t), A_2(t)$ and $\phi_2(t)$, to generate RF signals 126a and 126b. RF signals 126a and 126b are provided to PAs 108a and 108b, respectively, to be amplified into RF output signals 124a and 124b, based upon the level of bias signals 122a and 122b provided to amplifiers 108a and 108b, respectively. RF output signals 124a and 124b are combined by power combiner 202 into a single RF output signal 205 that is transmitted by antenna 110. It will be appreciated that an alternative approach (not shown) to providing signals 126a and 126b to power amplifiers 108a and 108b would be to utilize a single digital-to-RF modulator 106a (having an input from controller 104 specified as $A_1(t)$, $\phi_1(t)$, or $I_1(t)$, $Q_1(t)$) and use an RF split of the output of digital-to-RF modulator 106a to generate the two RF signals 126a and 126b. Such an approach is shown, for example, in U.S. patent application Ser. No. 14/920,031 filed on Oct. 22, 2015, assigned to the assignee of the present application and which is hereby incorporated herein in its entirety.

Thus, controller 104 sets, via control signals $A_1(t)$, $\phi_1(t)$, $A_2(t)$ and $\phi_2(t)$ (or their equivalents), the phase and amplitude of the RF input(s) provided to amplifiers 108a and 108b. Controller 104 further sets, by modulating the power supply level provided to amplifiers 108a and 108b via supply modulator 120, the amplification provided by amplifiers 108a and 108b and, thus, the RF output power of the system that is transmitted by antenna 110 (e.g., signals 124) to represent the data in signal 102. Controller 104 might continuously modulate the power supply level provided to amplifiers 108a and 108b, for example, based upon one or more samples of data 102 (e.g., one or more data samples of the baseband data signal to be transmitted). For example, controller 104 might adjust the power supply level of amplifiers 108a and 108b based upon a window of N samples of data 102 and determine whether, for one or more of the samples in the window, the output power of the system (e.g., the power supply level of amplifiers 108a and 108b) should be adjusted.

Figure 3:
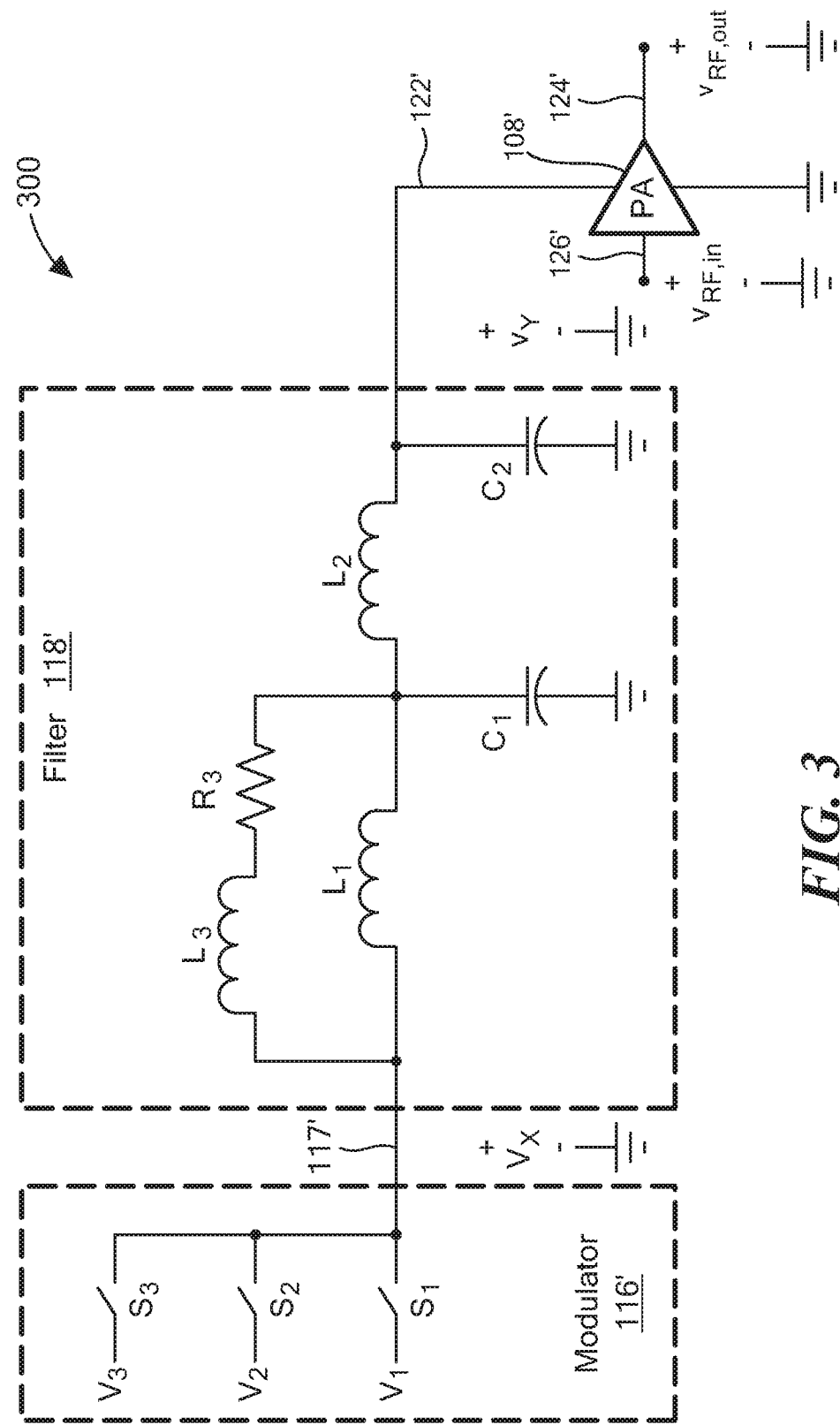
FIG. 3 is a schematic diagram of a multilevel RF PA system with a drain-voltage modulator and filter in accordance with illustrative embodiments.

Referring now to FIG. 3, a multilevel RF amplifier system 300 includes drain-voltage modulator 116' and transition shaping filter 118' supplying RF amplifier 108'. Drain modulator 116' modulates a bias voltage 122' applied to a bias terminal of amplifier 108' by switching voltages among multiple discrete voltage levels, shown in FIG. 3 as voltages $V_1$, $V_2$, and $V_3$, to provide output voltage $V_x$. Transition shaping filter 118' controls (e.g., smooths or otherwise shapes) transitions of output voltage $V_x$ such that filter output voltage $V_y$ provided as bias signal 122' to PA 108' has smooth transitions with high frequency content removed.

As shown in FIG. 3, some embodiments of drain modulator 116' include as many switches (e.g., switches $S_1$, $S_2$ and $S_3$) as there are input voltages (e.g., $V_1$, $V_2$, and $V_3$). In other embodiments, the number of switches might differ from the number of voltages (e.g., there might be a lesser or greater number of switches than voltage levels). Drain modulator 116' employs the switches to select a corresponding discrete input voltage level to provide as bias signal 122' to PA 108'. In some embodiments, switches 116' are provided as semiconductor devices. In other embodiments, other voltage selection techniques might alternatively be used, for example, mechanical devices.

As shown in FIG. 3, transition shaping filter 118' includes one or more filter stages of passive components (e.g., resistors, inductors and capacitors). For example, the embodiment shown in FIG. 3 includes a first filter stage including passive components $L_1$, $L_3$, $R_3$ and $C_1$, and a second filter stage including passive components $L_2$ and $C_2$. Although shown as including two filter stages, any number of filter stages might be employed. Passive components are beneficially employed as filter components since filters using passive components are simple, have high performance and are power efficient. However, active components could be used in addition or in the alternative to passive components.

In general, described embodiments prevent unwanted spectral content of signal 117' from appearing in signal 122' and mixing with the RF carrier, such that the frequency content of injected noise from signal 117' does not appear at an offset from the carrier frequency and/or the frequencies of signal 126' at RF output signal 124'. Stated differently, the spectral content of signal 122' ($v_Y$) mixes with the RF carrier (or the content of signal 126') such that the frequency content of injected noise from vY 122' partly appears at an offset from the carrier frequency or from the content of signal 126'. This portion of the frequency content of signal 124' is reduced (and ideally removed) by transition shaping filter 118'. In one embodiment, a high-order (e.g., two stage) filter is employed to substantially attenuate signal content above 30 MHz on the voltage 122' supplied to PA 108'. The cutoff frequency of the filter might be selected based upon the RF bandwidth required of a multilevel RF PA system (such as system 100 in FIG. 1 or system 300 in FIG. 3) such that any noise components present in the power supply provided to PA 108' are sufficiently small, for example, such that the out-of-band noise of the RF output 124' of PA system 300 does not interfere with or degrade the RF operation of the system (e.g., by putting noise at receive-band frequencies).

As shown in FIG. 3, voltage modulator 116' includes switches $S_1$, $S_2$ and $S_3$ that modulate a voltage $v_X$ 117', provided to filter 118', among voltage levels $V_1$, $V_2$, and $V_3$. Transition filter 118' controls (e.g., shapes or smooths) sharp transitions in voltage $v_X$ 117' such that the voltage $v_Y$ 122' provided to PA 108 has smooth transitions with reduced high-frequency content. In described embodiments, modulator 116' and transition filter 118' operate over a variety of operating conditions. For example, system 300 might operate under one or more of the following operating conditions: (1) an adaptive power tracking (APT) mode, in which the drain voltage need only be adapted slowly (e.g., by adjusting one or more of $V_1$, $V_2$, and $V_3$, and/or by switching among them at a low rate); (2) time-division duplexing (TDD), in which the signal bandwidth is wide, necessitating a high rate of transitions among levels and with rapid response of voltage $v_Y$ 122'; (3) frequency-division duplexing (FDD), with wide transmit signal bandwidth and a wide (e.g., >30 MHz) spacing between the transmit band and the receive band necessitating a high rate of transitions among levels and with rapid response of voltage $v_Y$ 122'; and (4) FDD with low transmit bandwidth and a small separation (e.g., <<30 MHz) between the transmit and receive bands, necessitating lower rates of transition in voltage $v_X$ 117' and the need for significant removal of high-frequency content in $v_Y$ 122' to reduce noise content in the receive band.

It is recognized, therefore, that some implementations of system 300 require many transitions in the voltage level of $v_X$ 117' such that $v_Y$ 122' has fast response with minimal filtering of high-frequency content (e.g., rapid modulation of $v_X$ 117' with a high cutoff frequency of transition shaping filter 118'), while other implementations of system 300 might require fewer voltage transitions of $v_X$ 117' but much more limited high frequency content such that $v_Y$ 122' has slower response with more filtering of high-frequency content (e.g., slow modulation of $v_X$ 117' with a low cutoff frequency of transition shaping filter 118'). Described embodiments achieve both high transition rate (e.g., fast response) and low transition rate (e.g., reduced high-frequency content) by employing modified transitioning techniques for changing the voltage level supplied to PA 108'.

For example, for a fast transition between two levels with limited filtering of high-frequency content in $v_Y$ 122', voltage modulator 116' might be used to step voltage $v_X$ 117' between the voltage levels V1, V2, V3, etc., and transition shaping filter 118' provides the necessary degree of filtering in $v_Y$ 122'. To further reduce high frequency content, voltage modulator 116' might employ switching patterns in the voltage transitions to further shape the $v_Y$ 122' and reduce high frequency content. In situations where a fast response is required, filter 118' might be implemented with a relatively high cutoff frequency, such that when voltage $v_X$ 117' is modulated among voltage levels (e.g., switching from $V_1$ to $V_2$, etc.), $v_Y$ 122' transitions quickly from $V_1$ to $V_2$. When fewer total level changes are needed but reduced high-frequency content in $v_Y$ 122' is necessary, described embodiments employ multi-pulse voltage level transitions such as shown in FIG. 4.

Figure 4A:
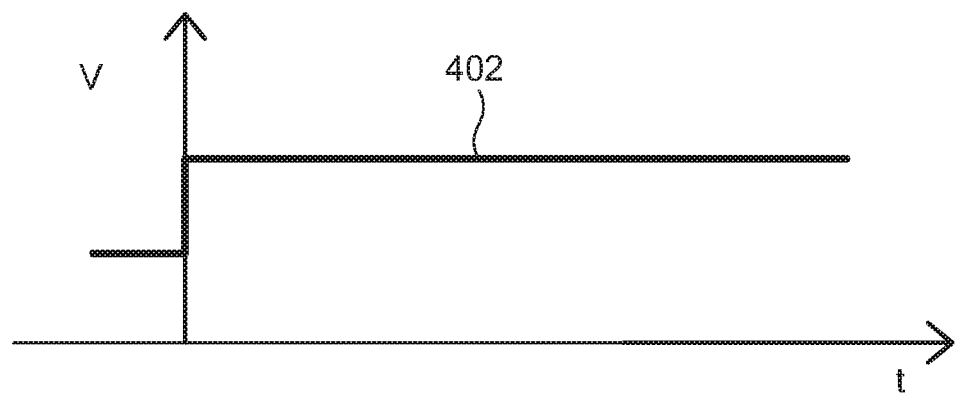
FIGS. 4A, 4B and 4C are timing diagrams showing a series of plots of voltage versus time for switching voltage waveform patterns for transitions among operating states of a PA in accordance with illustrative embodiments.
Figure 4B:
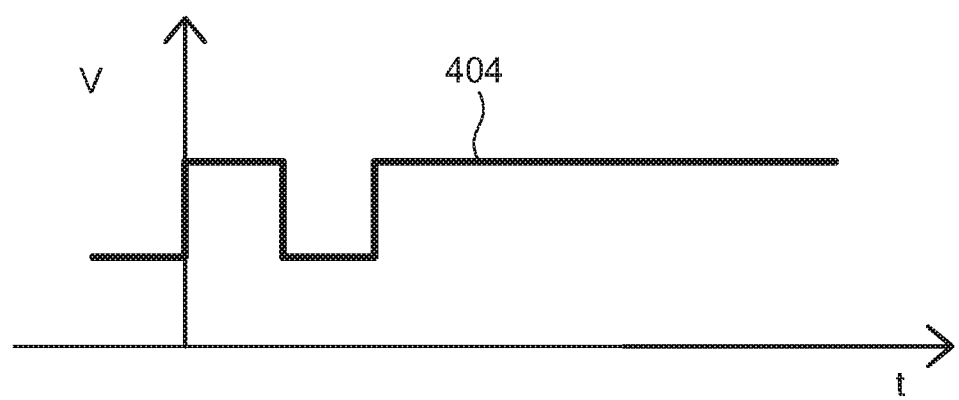
Figure 4C:
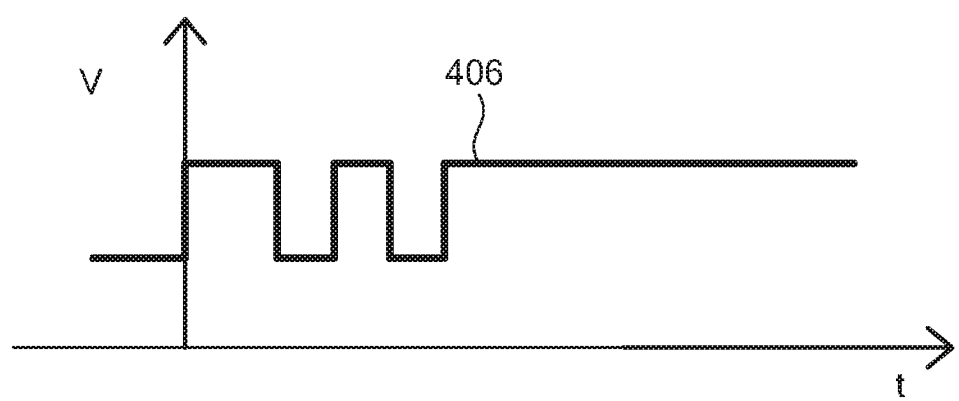

FIGS. 4A, 4B and 4C are plots of illustrative switching patterns 402, 404 and 406 for transitions among levels that, for example, would be observed in voltage 117' as shown in FIG. 3 in response to operation of switches 116'. Single-pulse transition 402 of FIG. 4A represents a standard change among voltage levels. In described embodiments, double-pulse transition 404 of FIG. 4B enables improved shaping of the frequency content of the resulting output waveform, at the expense of higher switching loss for the transition. Higher numbers of pulses might also be employed in a transition of voltage level $v_X$ 117', for example, "triple-pulse" transition 406 of FIG. 4C, or more generally, an "N-pulse" transition, where N is an integer greater than 1.

A trade-off exists between the number of pulse transitions and switching energy dissipation of drain modulator 116'. Employing double-pulse transition 404 results in higher switching energy dissipated (per net level change) as compared with the switching energy dissipated for single-pulse transition 402. However, employing multiple pulse transitions (e.g., transitions 404 or 406) with appropriate timing and duration of the pulses results in reduced high-frequency content in $v_Y$ 122' as compared to a single-pulse transition. Higher-frequency content can be further reduced with higher-order numbers of pulses per transition such as the triple-pulse transition 406.

Figure 5A:
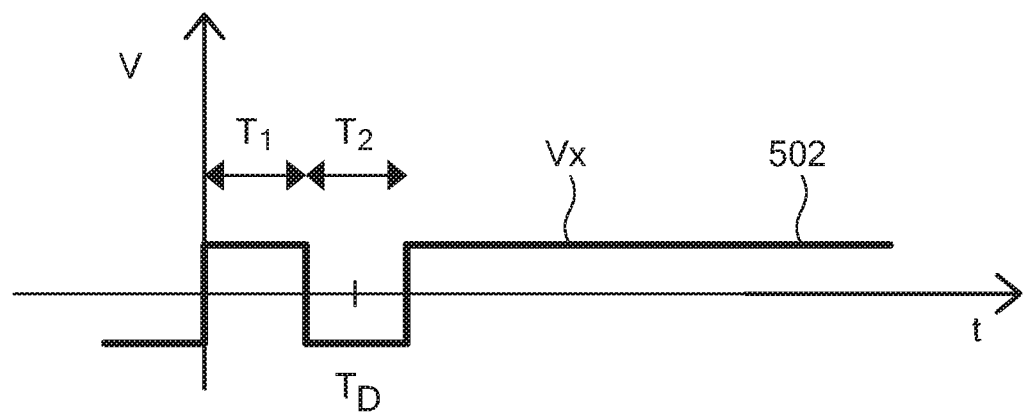
FIGS. 5A, 5B and 5C are timing diagrams showing a series of plots of voltage versus time for control signals transitioning among operating states of a PA in accordance with illustrative embodiments.
Figure 5B:
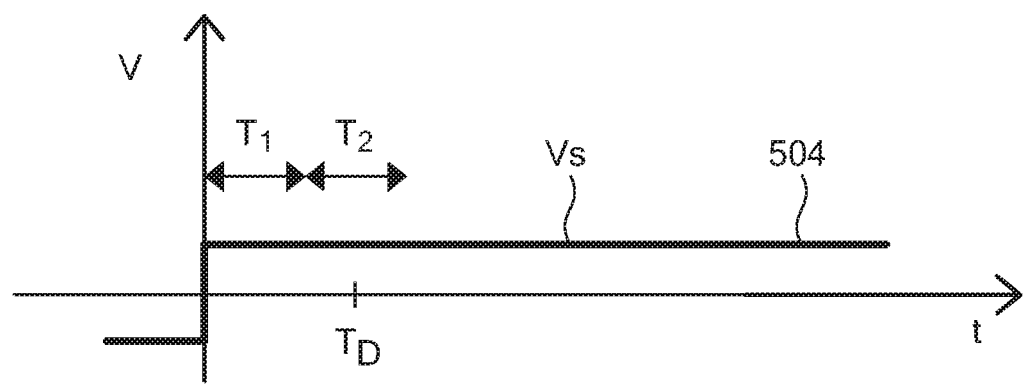
Figure 5C:
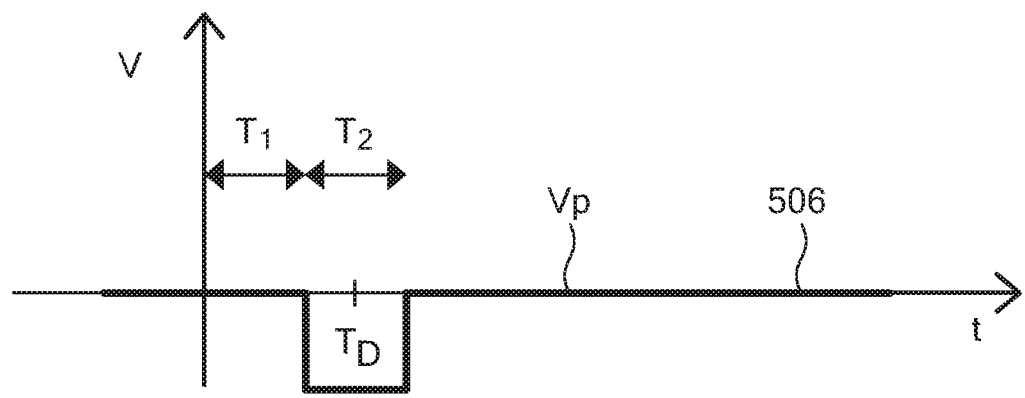

FIGS. 5A, 5B and 5C are series of plots of the AC components (e.g., without DC offset) of the voltage transitions shown in FIG. 4, plotted as voltage versus time. For example, the curves shown in FIGS. 5A-5C might be observed as the voltage $v_X$ 117' provided from drain modulator 116' to transition shaping filter 118'. Curve 502 in FIG. 5A illustrates the AC component of a double-pulse switching transition among levels that would be observed in voltage $v_X$ 117' as shown in FIG. 3. $T_1$ and $T_2$ represent the duration (or width) of each pulse in voltage $v_X$ 117', where $T_D = T_1 + 0.5 T_2$. The double-pulse transition can be expressed as the sum of the voltage step $v_S(t)$ shown as curve 504 in FIG. 5B and the voltage pulse $v_P(t)$ shown as curve 506 in FIG. 5C.

FIG. 5A shows the AC component of a double-pulse voltage transition of $v_X$ 117' among voltage levels (e.g., $V_1$, $V_2$, $V_3$, etc.). As will be shown, by proper sizing of the duration (e.g., $T_1$ and $T_2$) and positioning (e.g., at what time, t, the pulses occur) of the pulse $v_P$ (e.g., as shown in FIG. 5C) that is added to voltage $v_S$ to form $v_X$, content in a frequency range of interest can be reduced in $v_X$ 117' and $v_Y$ 122'. For example, the Fourier transforms of the waveforms in FIG. 5 can be shown as:

$$v_X(\omega) = v_S(\omega) + v_P(\omega) = \frac{1}{\omega} e^{-j\pi/2} - \frac{2}{\omega} \sin\left(\frac{\omega T_2}{2}\right) e^{-j\omega T_D}$$

$$v_S(\omega) = \frac{1}{\omega} e^{-j\pi/2}$$

-continued $$v_P(\omega) = -\frac{2}{\omega} \sin\left(\frac{\omega T_2}{2}\right) e^{-j\omega T_D}$$

where $v_X$ is voltage waveform shown in FIG. 5A, $v_S$ is the step waveform shown in FIG. 5B, and $v_P$ is the pulse waveform shown in FIG. 5C. Thus, by properly selecting $T_D$ and $T_2$ (or $T_1$ and $T_2$), and properly timing them at time t, the amplitude of $v_X$ in a frequency range of interest can be reduced.

Appropriate selection of $T_1$ and $T_2$ results in desirable filtering in a double-pulse transition. In one embodiment, $T_1 = T_2$, which places a null at an angular frequency given by:

$$\omega_x = \frac{\pi}{3 T_2}$$

The selection $T_1 = T_2$ enables easy digital implementation with operation on a fixed time grid. Thus, an AC component of the output voltage of the voltage modulator associated with a voltage transition is represented in the frequency domain by:

$$v_X(\omega) = v_S(\omega) + v_P(\omega) = \frac{1}{\omega} e^{-j\pi/2} - \frac{2}{\omega} \sin\left(\frac{\omega T_2}{2}\right) e^{-j\omega T_D}$$

where $v_X(\omega)$ is a Fourier representation of a multi-pulse output voltage of the at least one voltage modulator, $v_S(\omega)$ is a Fourier representation of a step function associated with a transition between discrete voltages of the at least one voltage modulator, and $v_P(w)$ is a Fourier representation of a pulse function associated with a transition between discrete voltages of the at least one voltage modulator, and where $T_2$ and $T_D$ are time durations associated with the pulse function. Other embodiments might employ other relationships between $T_1$ and $T_2$ to shape the frequency content of $V_x$, as shown in FIGS. 7 and 8, discussed below.

Figure 6A:
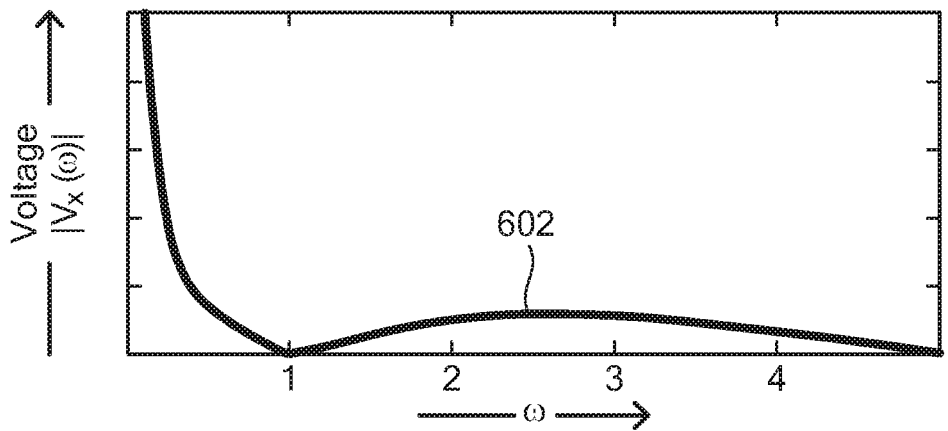
FIG. 6A is a plot of frequency versus time showing frequency-domain voltage magnitude content associated with the voltage transitions caused by the control signal of FIG. 5A.
Figure 6B:
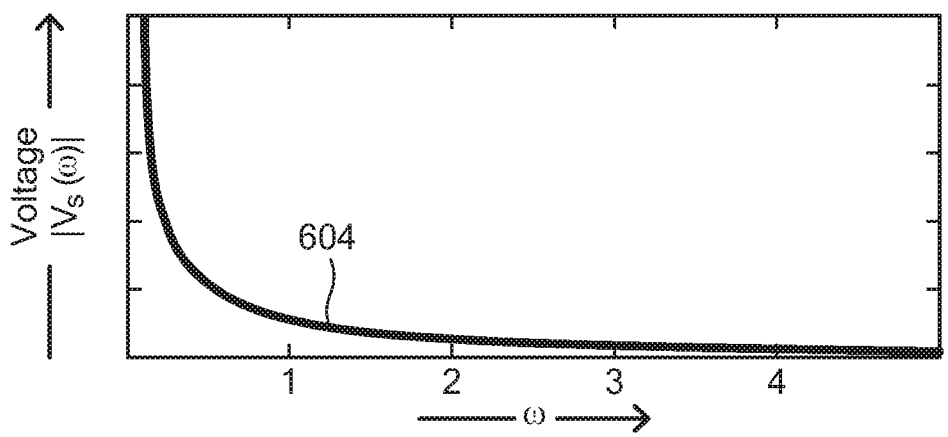
FIG. 6B is a plot of frequency versus time showing frequency-domain voltage magnitude content associated with the voltage transitions caused by the control signal of FIG. 5B.
Figure 6C:
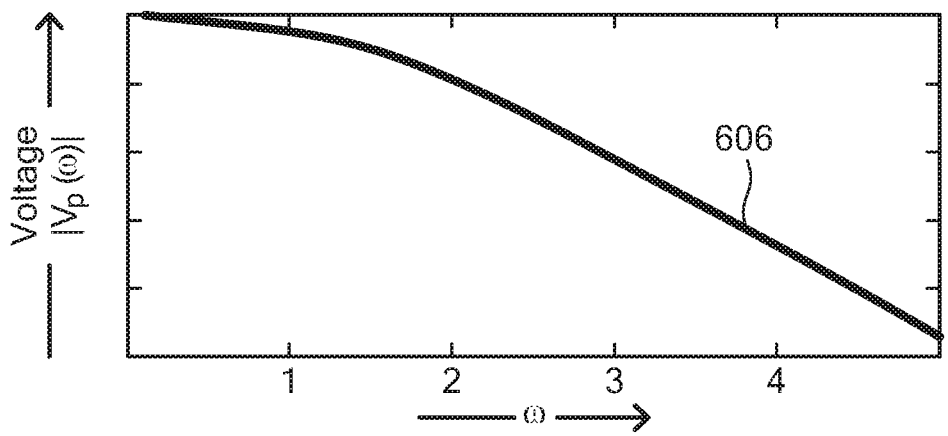
FIG. 6C is a plot of frequency versus time showing frequency-domain voltage magnitude content associated with the voltage transitions caused by the control signal of FIG. 5C.

FIGS. 6A-6C show plots of the frequency-domain voltage magnitude content for the corresponding voltage transition patterns shown in FIGS. 5A-5C. For example, the curves shown in FIGS. 6A-6C might be observed as spectral components of the voltage 117' provided from drain modulator 116' to transition shaping filter 118'. FIG. 6A shows the complete spectral content (of the ac component) while FIGS. 6B and 6C show constituent parts of that spectral content associated with the component waveform of FIG. 5A shown in FIGS. 5B and 5C. As shown in FIG. 6A, using the double-pulse transition enables a null (or small-amplitude region) to be placed in the frequency domain content of voltage 117', allowing improved filtering by filter 118' of frequency-domain components in voltage 122' provided to PA 108'.

Referring now to FIG. 6A, curve 602 illustrates the frequency response of a double pulse voltage transition. As shown, a double pulse transition has content at higher frequencies (e.g., above $\omega=1$) that is larger than that of just a step (e.g., curve 604 of FIG. 6B). Curve 606 in FIG. 6C illustrates the frequency response of example pulse $V_P$ shown in FIG. 5C representing the difference between the double-pulse transition and the single-pulse transition, which also has significant higher frequency content (e.g., near $\omega=1$ and above). However, by selecting an appropriate pulse width and delay and adding it to the single-pulse transition, as shown by curve 602 in FIG. 6A, the double-pulse transition has greatly reduced frequency content in a range of interest (e.g., the null located at ω=1). This reduced frequency content lowers the burden on transition filter 118' in this frequency range, enabling the use of a transition filter with a higher cutoff frequency than with only a single pulse transition. Although the very-high-frequency content of $v_X$ 117' for the double-pulse transition (e.g., well above ω=1, such as ω~2-3) is actually higher than that of the single-pulse transition, content in this frequency range is much more readily filtered by transition filter 118'.

Figure 7A:
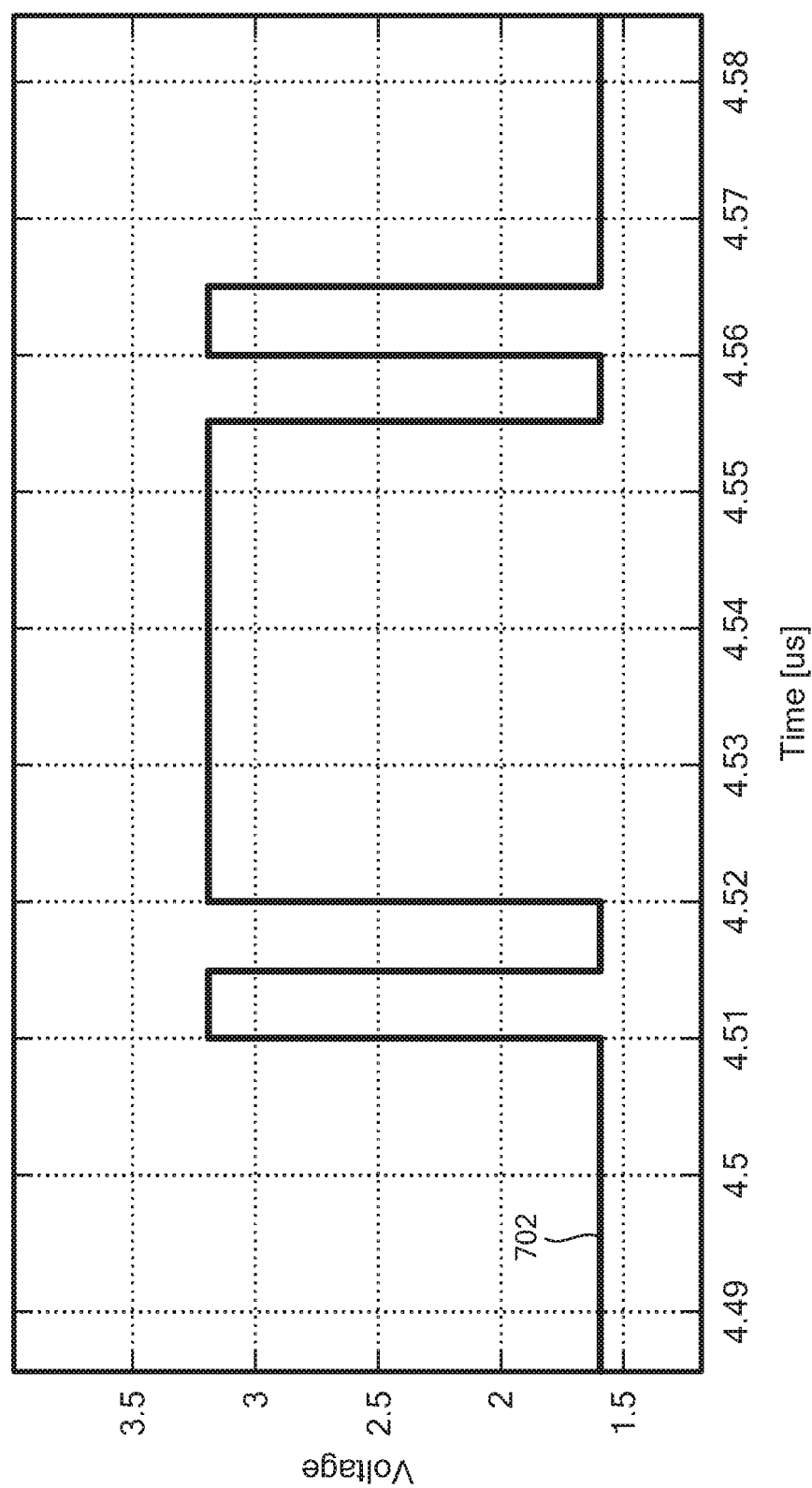
FIG. 7A is a plot of voltage versus time showing a time-domain voltage response of a drain modulation waveform for a first operating state of the PA system shown in FIG. 3.
Figure 7B:
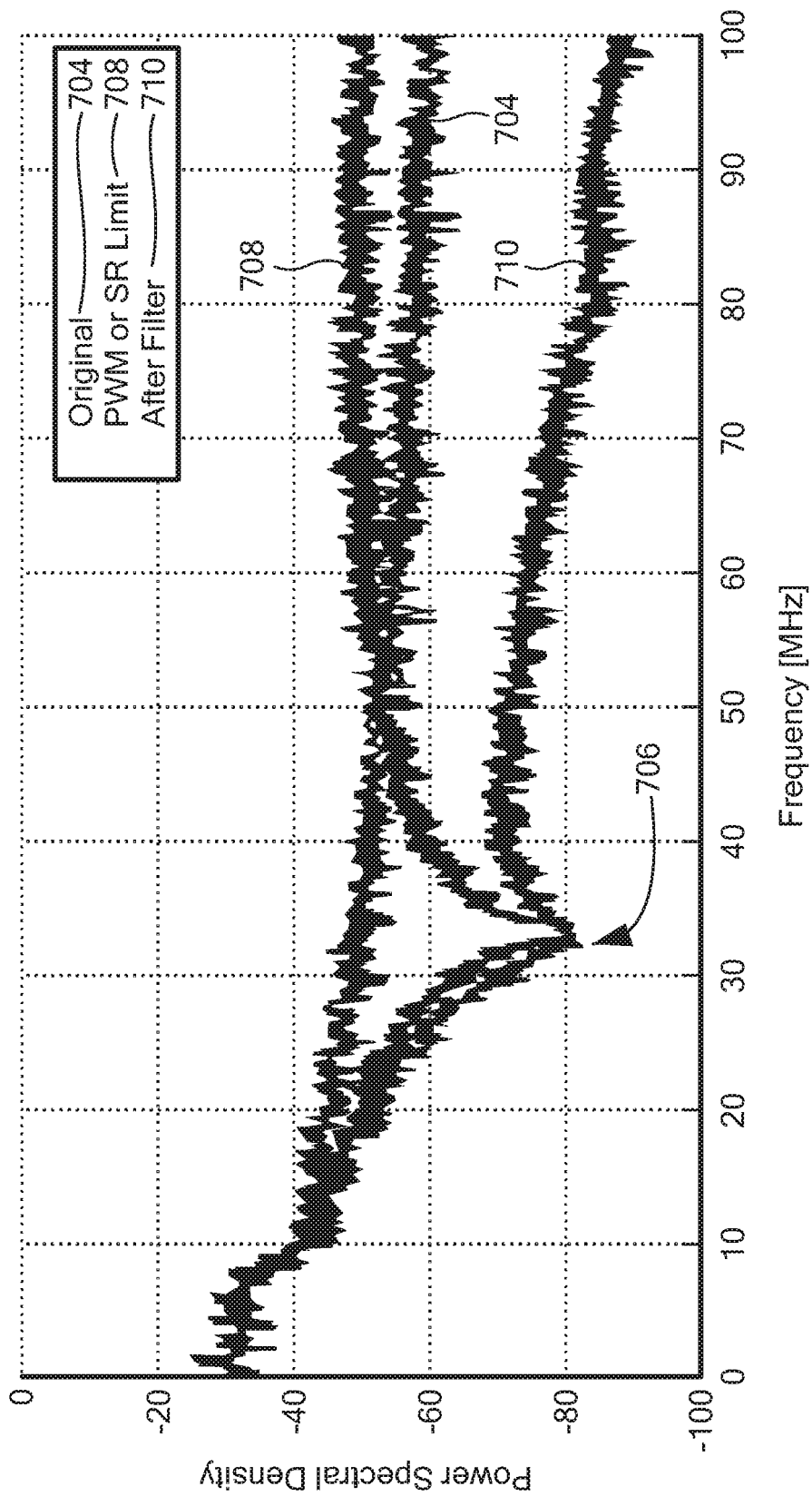
FIG. 7B is a plot showing power spectral density of the filtered output for a first operating state of the PA system shown in FIG. 3.
Figure 8:
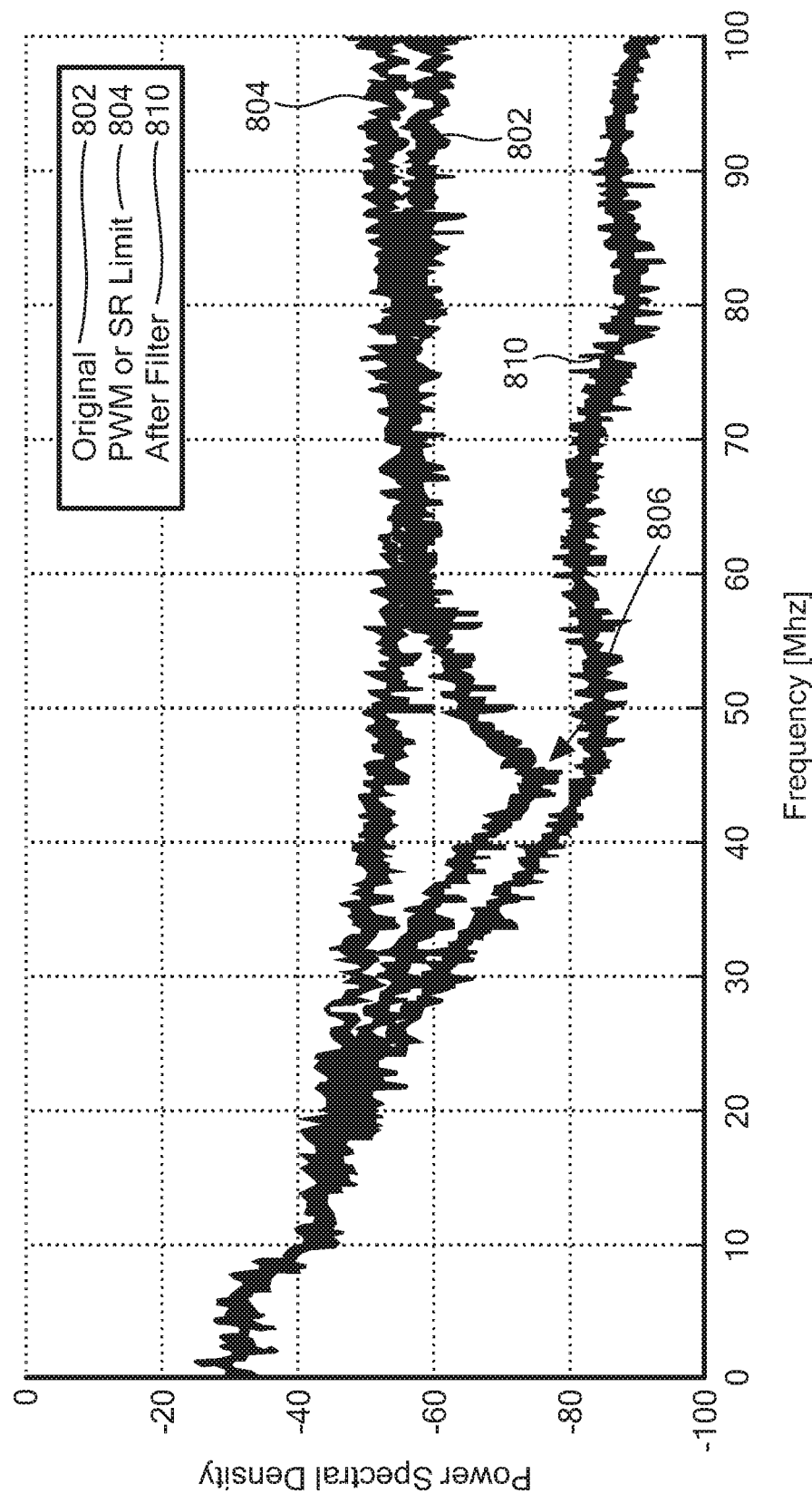
FIG. 8 is a plot showing power spectral density of the filtered output for a first operating state of the PA system shown in FIG. 3.

FIGS. 7A and 7B show plots of illustrative double-pulse transitions of voltage 117', including both AC and DC components. Curve 702 in FIG. 7A illustrates the time-domain response of a drain modulation waveform having double-pulse transitions on voltage $V_x$ 117' before filter 118', with $T_1=T_2=5$ ns. Curve 704 in FIG. 7B illustrates the power spectral density of a single-pulse transition and curve 708 illustrates the power spectral density of a double-pulse transition (e.g., at voltage 117' before filter 118'). Curve 710 illustrates the power spectral density of the slew-rate limited waveform output from filter 118' (e.g., voltage 122' after filter 118') for a double-pulse transition.

FIG. 8 shows a similar plot as FIG. 7B, for double-pulse transitions having $T_1=4$ ns and $T_2=3.5$ ns. Curve 802 illustrates the power spectral density of a single-pulse transition and curve 804 illustrates the power spectral density of a double-pulse transition (e.g., at voltage 117' before filter 118'). Curve 810 illustrates the power spectral density of the slew-rate limited waveform output from filter 118' with a double-pulse transition. As illustrated by curve 804, the notch (e.g., notch 806) in the power spectral density owing to the double transition with these times is shallower and wider than in the case of the notch (e.g., notch 706) shown in FIG. 7B.

Thus, as shown in FIGS. 7B and 8, as compared to employing a single-pulse transition (e.g., as illustrated by curves 704 and 802), employing a double-pulse transition (e.g., as illustrated by curves 708 and 804) results in a reduction in amplitude of spectral components in a frequency range of interest (e.g., in this illustrative embodiment, between 30 and 40 MHz, as indicated by notches 706 and 806). It should be noted, however, that such a reduction in amplitude might be provided at any desired frequency or frequency range by using multiple pulse transitions. It should also be noted that employing additional pulses (e.g., more than a single pulse) increases high frequency spectral content due to the additional transition edges (e.g., the amplitude of spectral content of curve 708 is greater spectral than the amplitude of the spectral content of curve 704 above approximately 60 MHz, and the amplitude of the spectral content of curve 804 is greater than the amplitude of the spectral content of curve 802 above approximately 70 MHz). However, this high frequency spectral content can more easily be filtered by a single filter (e.g., transition shaping filter 118), as indicated by curves 710 and 810. Thus, transition shaping filter 118 can be used to control, shape or attenuate the amplitude of spectral components resultant from the multiple pulse transitions. Accordingly, as illustrated in FIGS. 7B and 8, employing a double-pulse transition (e.g., curves 708 and 804) in combination with the transition shaping filter having appropriately selected filter characteristics results in a reduction of spectral component amplitude in a desired frequency range.

Figure 9:
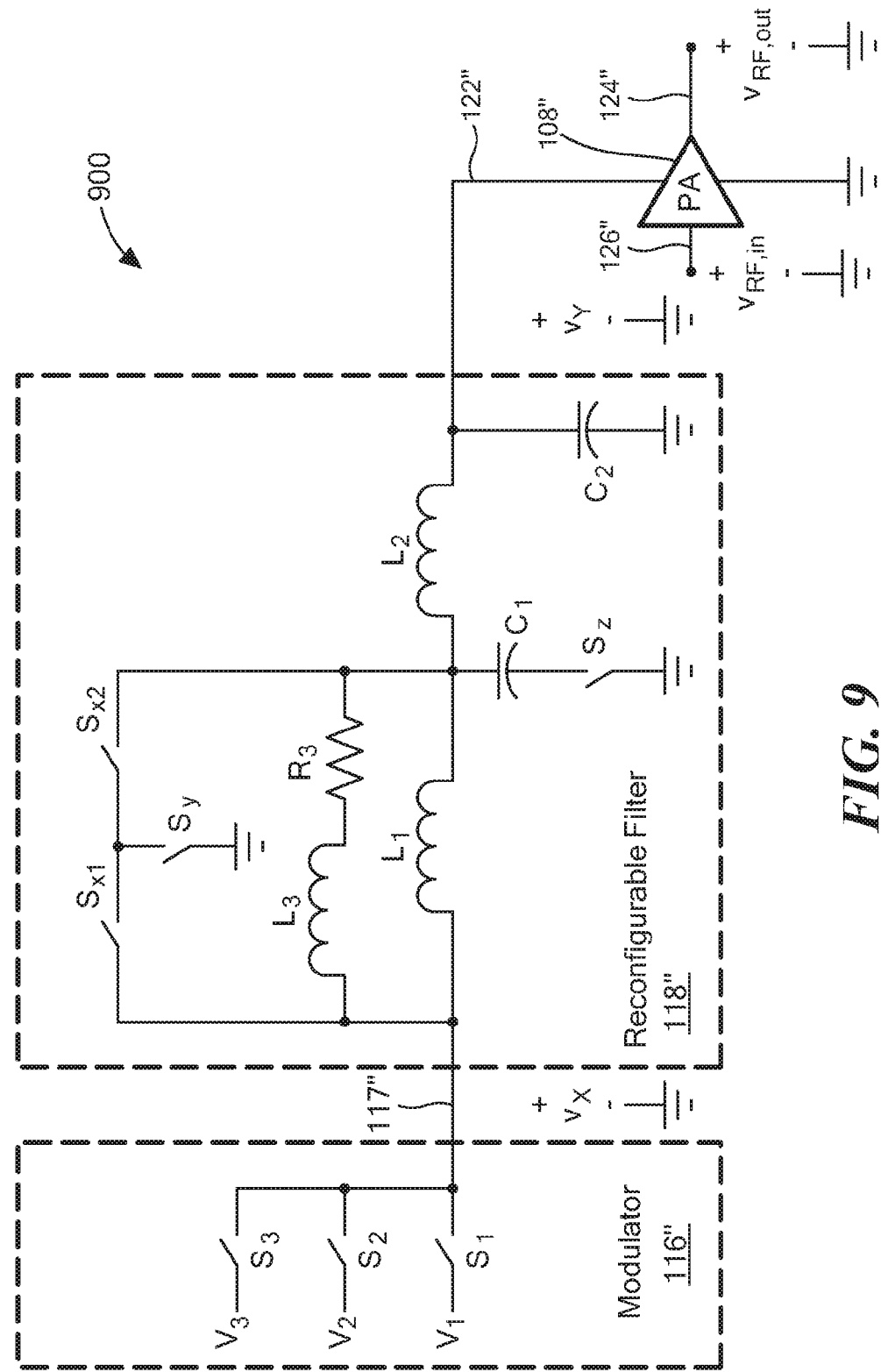
FIG. 9 is a schematic diagram of an illustrative multilevel power amplifier system having a reconfigurable transition filter.

Referring now to FIG. 9, multilevel power amplifier system 900 includes drain modulator 116" and a reconfigurable transition shaping filter 118" supplying an RF amplifier 108". Similar to the system shown in FIG. 3, drain modulator 116" modulates the voltage applied to PA 108" by switching voltages among multiple discrete voltage levels, shown as voltages $V_1$, $V_2$, and $V_3$, to provide output voltage 117". Transition shaping filter 118" shapes (e.g., smooths) transitions of output voltage 117" such that voltage $v_Y$ provided as bias signal 122" to PA 108" has smooth transitions with high-frequency content removed. As shown, some embodiments of drain modulator 116" include as many switches (e.g., switches $S_1$, $S_2$ and $S_3$) as there are input voltages (e.g., $V_1$, $V_2$, and $V_3$). Drain modulator 116" employs each of the switches to select a corresponding discrete input voltage level to provide as bias signal 122" to PA 108".

Employing a dynamically reconfigurable transition shaping filter 118" allows described embodiments to be employed over wide operating ranges, and applied separately from or together with multi-pulse transitions such as shown in FIG. 4. By switching in and out filter components using switches $S_{X1}$, $S_{X2}$, $S_Y$ and $S_Z$, the bandwidth of filter 118" can be adjusted in response to varying operating conditions (e.g., TDD vs. FDD operation, operation with different transmit and receive band separations, operation in different modes such as envelope tracking, envelope tracking advanced, adaptive power tracking, etc.).

It will be recognized that many other reconfigurable filter designs are possible. This includes use of switches to add or remove filter components and/or stages (e.g., change filter cutoff and/or order) and/or use of other numbers and locations of switches $S_{X1}$, $S_{X2}$, $S_Y$ and $S_Z$. Although use of shunt switches (especially ground-referenced shunt switches such as switch $S_Z$) is easily implemented and operated, other switch configurations are possible. In addition to switches in series and/or parallel with filter elements, more sophisticated structures might be employed. For example, to bridge or short a series component, a "T" structure (e.g., switches $S_{X1}$, $S_{X2}$, and $S_Y$) might be beneficially employed since parasitic capacitance across switches $S_{X1}$ and $S_{X2}$ do not bypass the filter inductor $L_1$ when switches $S_{X1}$, $S_{X2}$ and $S_Y$ are closed, but rather are shunted to ground. Thus, the "T" shown in FIG. 9 reduces the impact of switch capacitance on performance of filter 118".

Thus, the characteristics of filter 118" might be changed by reconfiguring switches $S_{X1}$, $S_{X2}$, $S_Y$ and $S_Z$ or by adjusting the values of configurable components (e.g., if one or more of $L_1$, $L_2$, $L_3$, $R_3$, $C_1$ and $C_2$ are variable components).

Although FIG. 9 is shown as employing only switches and passive components, active components might additionally or alternatively be employed. For example, reconfigurable filters might include electrically variable filters components such as varactors, crossed-field reactors or similar components, transistors, operational amplifiers and other components that allow electronic adjustment of filter performance. Some embodiments might employ multiport filter components. For example, a two-winding, two-port magnetic structure (e.g., a coupled inductor or transformer) might have a first port used as a filter inductor, and a second port shunted by a switch, such that the effective inductance of the first port depends upon the state of the configuration switch. Filter performance might also be adjusted by actively adjusting filter damping.

Transition shaping filter 118" includes one or more filter stages comprising passive components. Transition shaping filter 118" includes a first filter stage including passive components $L_1$, $L_3$, $R_3$ and $C_1$ and switches $S_{X1}$, $S_{X2}$, $S_Y$ and $S_Z$. Further, the embodiment shown in FIG. 9 also includes a second filter stage that also includes passive components $L_2$ and $C_2$. Inclusion of switches $S_{X1}$, $S_{X2}$, $S_Y$ and $S_Z$ enables filter 118'' to be dynamically configured during operation of system 100. For example, a first filter configuration is provided when switches $S_Y$ and $S_Z$ are closed and switches $S_{X1}$ and $S_{X2}$ are open. A second configuration of the filter is provided when switch $S_Y$ is closed and switches $S_{X1}$, $S_{X2}$ and $S_Z$ are open. A third configuration of the filter is provided when switches $S_{X1}$ and $S_{X2}$ are closed and switches $S_Y$ and $S_Z$ are open. Each of these configurations provides a different combination of high-frequency attenuation filter characteristics and response speed of voltage 122 provided to PA 108.

Figure 10:
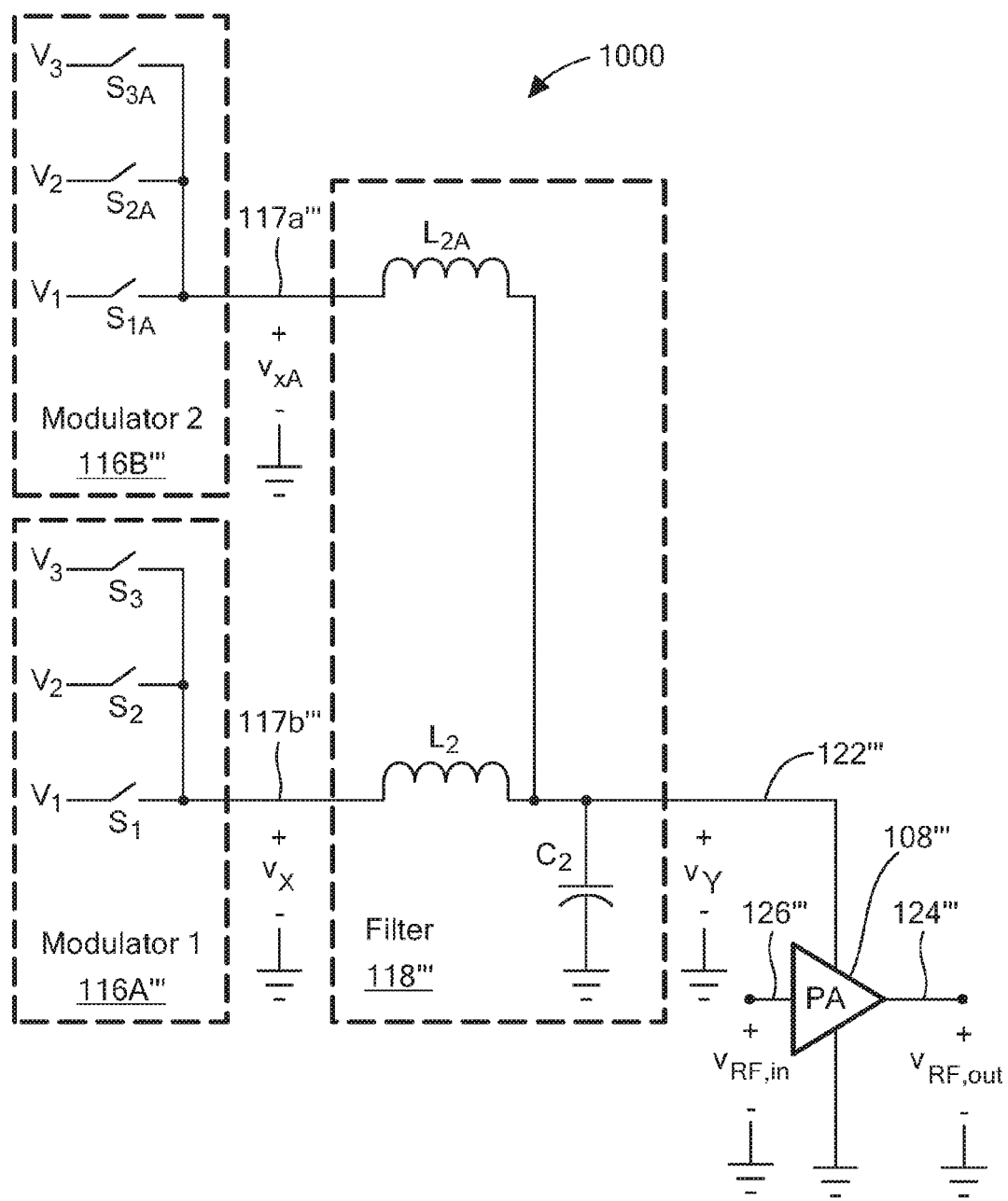
FIG. 10 is a schematic diagram of an illustrative multilevel power amplifier system having multiple drain voltage modulators and a multiple-input, single-output transition filter.

Referring now to FIG. 10, multilevel power amplifier system 1000 includes multiple drain voltage modulators and a multiple-input, single-output transition filter. As shown in FIG. 10, inductor $L_{2A}$ is coupled to voltage modulator 116B''', and inductor $L_2$ is coupled to voltage modulator 116A'''. Inductor $L_{2A}$ might have an inductance value that is equal to, less than, or greater than the inductance of $L_2$. If the inductance of $L_2$ is much larger than the inductance of $L_{2A}$, then there will be a slower response of voltage $V_Y$ to inputs from modulator 1 116A''' than from modulator 2 116B''' if only one of the modulators are employed at a given time. Thus, under operating conditions of system 100 where low ripple/noise and low bandwidth are desired, power can be provided to PA 108''' from modulator 1 116A''', with all the switches of modulator 2 116B''' remaining in the off or open position. Under operating conditions of system 100 where higher response speed is desired, power can be provided to PA 108''' from modulator 2 116B''', with all the switches of modulator 1 116A''' remaining in the off or open position.

Under operating conditions of system 1000 where a highest response speed is desired, power can be provided to PA 108''' from both modulator 1 116A''' and modulator 2 116B''' (e.g., modulator 1 116A''' and modulator 2 116B''' are operated in parallel with synchronized timing among the corresponding switches $S_1$, $S_2$, $S_3$, $S_{1A}$, $S_{2A}$, and $S_{3A}$). Use of both modulator 1 116A''' and modulator 2 116B''' in parallel also provides the opportunity to source high power at low loss. Use of both modulator 1 116A''' and modulator 2 116B''' in parallel further allows described embodiments to shape the transitions in voltage $V_Y$ by staggering the timing with which the switching transitions are made in modulator 1 116A''' and modulator 2 116B''' (e.g., a configurable timing delay or offset between the switching among levels in one voltage modulator in reference to the switching of the other voltage modulator).

Described embodiments might provide magnetic coupling between inductors $L_2$ and $L_{2A}$ shown in FIG. 10. Magnetic coupling of inductors $L_2$ and $L_{2A}$ allows shaping differential-mode currents to output 122''' from voltage modulators 116A''' and 116B''' separately from shaping common-mode currents from each of the modulators 116A''' and 116B''' to output 122'''. Further, such magnetic coupling might reduce the size of inductors $L_2$ and $L_{2A}$. In some embodiments, $L_2$ and $L_{2A}$ might employ a common core structure, without magnetic coupling, which still might result in a reduction in the size of inductors $L_2$ and $L_{2A}$. Although shown in FIG. 10 as employing two voltage modulators 116A''' and 116B''', M modulators, where M is an integer greater than one, can be utilized with a variety of kinds of multi-input (e.g., M ports, such that there is one port for each modulator) systems having at-least-one-output to one or more corresponding PAs 108'''. As described, the M modulators might be utilized individually (with the other modulator "off") or together in a coordinated fashion to provide various characteristics in the output waveform and its transitions to one or more PAs 108''' coupled to the filter.

Figure 11:
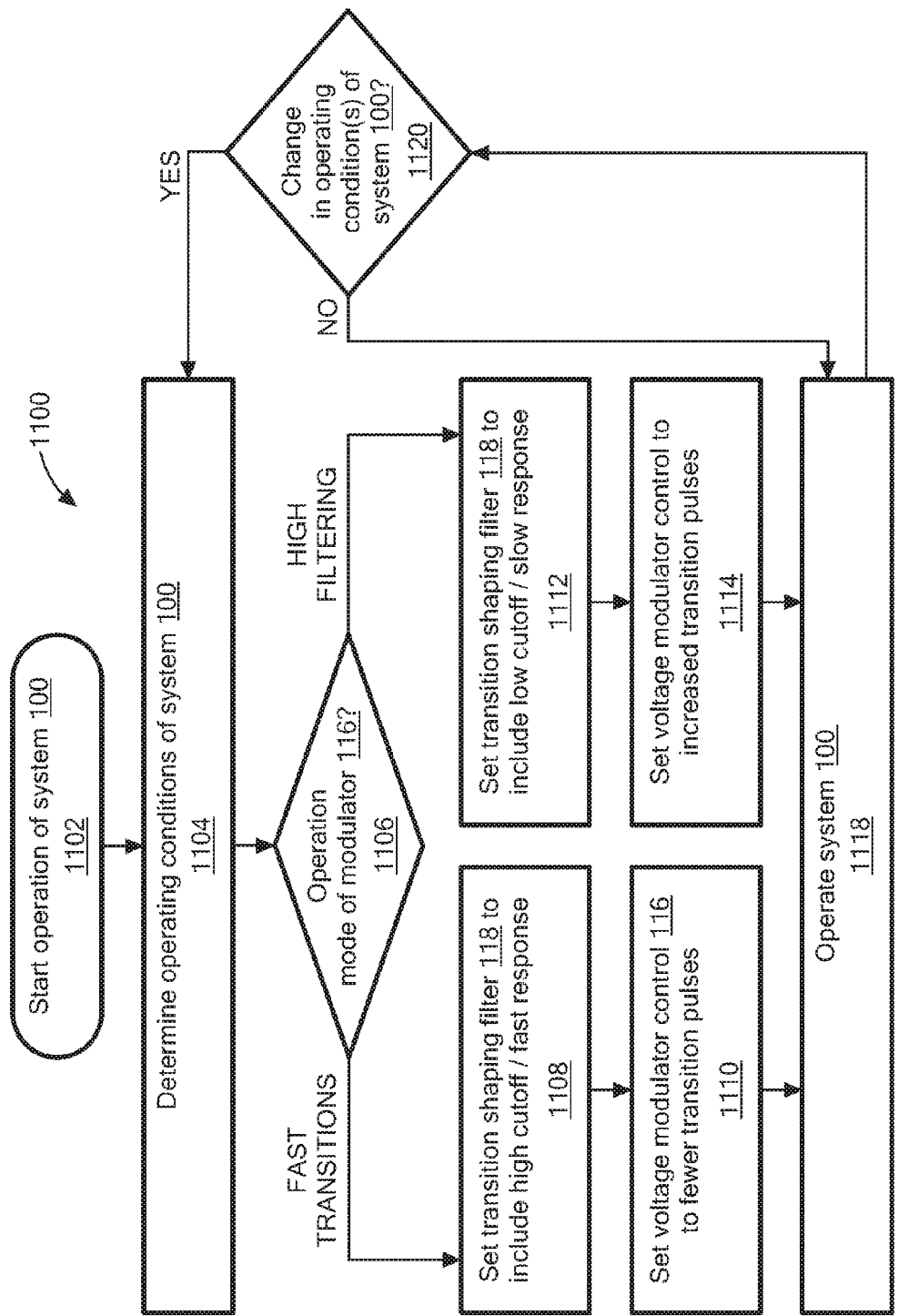
FIG. 11 is a flow diagram of a voltage modulation technique in accordance with illustrative embodiments.

FIG. 11 is a flow diagram of a voltage transition technique 1100 that might be employed by system 100 shown in FIG. 1, for example. At block 1102, operation of system 100 starts, for example by powering system 100. At block 1104, one or more operating conditions of system 100 are determined. For example, whether system 100 is operating in one of 4 modes: (1) adaptive power tracking (APT) mode, in which the drain voltage is adapted slowly (e.g., by adjusting one or more of $V_1$, $V_2$, and $V_3$, and/or by switching among them at a low rate); (2) time-division duplexing (TDD) mode, in which the signal bandwidth is wide and there is a high rate of transitions among levels with rapid response of voltage $V_Y$; (3) frequency-division duplexing (FDD), with wide transmit signal bandwidth and a wide (e.g., >30 MHz) spacing between the transmit band and the receive band necessitating a high rate of transitions among levels and rapid response of voltage $V_Y$; and (4) FDD with low transmit bandwidth and a small separation (e.g., <<30 MHz) between the transmit and receive bands, necessitating lower rates of transition in voltage $V_x$ and the need for significant removal of high-frequency content in $V_Y$ to reduce noise content in the receive band.

At block 1106, it is determined whether the operating conditions of system 100 require fast transitions in voltage 122, or high filtering capability of voltage 122. Although shown as two decision paths (e.g., "Fast Transitions" and "High Filtering"), there might be additional decision paths. For example, one decision path for each mode of operation described above. Other numbers of decision paths might be beneficially employed. If, at block 1106, a decision is made that fast voltage transitions are required, then at block 1108 components are removed from transition shaping filter 118 (e.g., via switching one or more of switches $S_{X1}$, $S_{X2}$, $S_Y$ and $S_Z$ of FIG. 9).

At block 1110, voltage modulator 116 is set to transition between voltages using fewer transition pulses (e.g., the single pulse transition shown in FIGS. 4 and 5 versus a double-, triple- or N-pulse transition signal). At block 1116, voltage 122 is determined and supplied to PA 108.

Alternatively, if, at block 1106, a decision is made that high noise filtering is required, then process 1100 proceeds to block 1112 where components are added into transition shaping filter 118 (e.g., via switching one or more of switches $S_{X1}$, $S_{X2}$, $S_Y$ and $S_Z$ of FIG. 9). Process 1100 proceeds to block 1114, where voltage modulator 116 is set to transition between voltages using additional transition pulses (e.g., the double-, triple- or N-pulse transition signal instead of the single pulse transition as shown in FIGS. 4 and 5). In embodiments where more operating modes are desired, additional decision branches/blocks might be provided having modes that combine high-cutoff and fast response filter configurations with additional transition pulses, and low cutoff/slow response filter configurations with fewer transition pulses. In embodiments having multiple PAs 108 and/or multiple voltage modulators 116, blocks 1106 through 1114 might be repeated for each PA 108.

At block 1118, system 100 is operated in accordance with the operating conditions determined at block 1104 and the settings adapted in blocks 1106 through 1114. During operation at block 1118, voltage level of voltage 122 is modulated and supplied to PA 108, for example by switching one or more of switches $S_1$, $S_2$, and $S_3$. At block 1120, if settings of system 100 need to change, for example if operating conditions of system 100 change, then processing returns to block 1104 and adjustments in settings to system 100 can be determined and applied. Otherwise, system 100 continues to operate with its current settings at block 1118.

It should be appreciated that typically the operating voltage is set repeatedly (and typically very rapidly) in response to the characteristics of the RF signal to amplify and transmit. Thus, the operating voltage typically changes at a rate that is much faster than a rate at which transition shaping filter is reconfigured. It is, however, possible that in some applications the rate at which the transition filter is reconfigured is equal to or greater than the rate at which the operating voltage is set.

It should also be appreciated that the switches (e.g., switches $S_1$, $S_2$, $S_3$, $S_{1A}$, $S_{2A}$, $S_{3A}$, $S_{X1}$, $S_{X2}$, $S_Y$ and $S_Z$) might be provided as mechanical switches or might preferably be implemented as one or more transistors or other semiconductor switching elements. Further, although shown as single devices for illustrative purposes, described embodiments might employ multiple semiconductor switches coupled together to achieve desired electrical characteristics from the combination, such as a desired physical size (e.g., gate width and length) or operating characteristic (e.g., isolation, voltage blocking capability, switching speed, threshold voltage, gain, bidirectionality, etc.).

Thus, as described herein, embodiments provide a radio frequency (RF) amplifier system having at least one amplifier. The at least one amplifier includes an RF input port, an RF output port and a drain bias port. At least one voltage modulator is coupled to the bias port of the least one amplifier to provide a bias voltage. The bias voltage is selected by switching among a plurality of discrete voltages. At least one filter circuit is coupled between the at least one voltage modulator and the at least one amplifier. The at least one filter circuit controls spectral components resultant from transitions in the bias voltage when switching among the plurality of discrete voltages. Hence, the bias signal provided to the amplifier, is provided having the amplitudes of undesirable spectral components resultant from the transitions attenuated (and ideally, eliminated). A controller dynamically adapts at least one setting of the at least one voltage modulator by using multi-pulse transitions when switching among the plurality of discrete voltages for a first operating condition of the RF amplifier.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Signals and corresponding nodes or ports may be referred to by the same name and are interchangeable for purposes here.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Some embodiments might be implemented in the form of methods and apparatuses for practicing those methods. Described embodiments might also be implemented in the form of program code embodied in tangible media, such as magnetic recording media, hard drives, floppy diskettes, magnetic tape media, optical recording media, compact discs (CDs), digital versatile discs (DVDs), solid state memory, hybrid magnetic and solid state memory, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a processing device, the program code segments combine with the processor to provide a unique device that operates analogously to specific logic circuits. Such processing devices might include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments might also be implemented in the form of a bitstream or other sequence of signal values electrically or optically transmitted through a medium, stored magnetic-field variations in a magnetic recording medium, etc., generated using a method and/or an apparatus as recited in the claims.

It should be understood that the steps of the methods set forth herein are not necessarily required to be performed in the order described, and the order of the steps of such methods should be understood to be merely illustrative. Likewise, additional steps may be included in such methods, and certain steps may be omitted or combined, in methods consistent with various embodiments.

It will be further understood that various changes in the details, materials, and arrangements of the parts that have been described and illustrated herein might be made by those skilled in the art without departing from the scope of the following claims.

We claim:

1. A radio frequency (RF) amplifier system comprising:
   at least one amplifier having an RF input port, an RF output port and a bias port;
   at least one voltage modulator coupled to the bias port of the least one amplifier to provide a bias voltage, the bias voltage selected by switching among a plurality of discrete voltages;
   at least one filter circuit coupled between the at least one voltage modulator and the at least one amplifier, the at least one filter circuit configured to control at least some spectral components resultant from transitions in the bias voltage when switching among the plurality of discrete voltages; and
   a controller configured to dynamically adapt at least one setting of the at least one voltage modulator by using multi-pulse transitions when switching among the plurality of discrete voltages in a first operating condition of the RF amplifier, wherein the controller is configured to adapt at least one setting of the at least one voltage modulator to select the bias voltage among the discrete voltages by the at least one voltage modulator according to a switching pattern having two or more transition pulses.

2. The system of claim 1 wherein the multi-pulse transitions are selected to reduce spectral components at the RF output port of the at least one amplifier.

3. The system of claim 2, wherein the spectral components result from switching among the plurality of discrete voltages.

4. The system of claim 1, wherein the controller is further configured to dynamically adapt the at least one setting of the at least one voltage modulator by using single-pulse transitions when switching among the plurality of discrete voltages in a second operating condition of the RF amplifier.

5. The system of claim 4, wherein the transceiver is operable in one or more frequency bands and the controller is configured to adapt the at least one setting of the at least one voltage modulator and the at least one setting of the at least one filter circuit based, at least in part, on a frequency band in which the transceiver is operating.

6. The system of claim 1 wherein said at least one filter circuit is a reconfigurable circuit, wherein the controller is configured to adapt a configuration of the at least one filter circuit.

7. The system of claim 6, wherein the reconfigurable circuit comprises one or more configurable components, the controller configured to add or remove each of the one or more configurable components from the filter based on the operating mode of the RF amplifier.

8. The system of claim 1, wherein a number, duration and timing of the two or more transition pulses is selected based upon an operating mode of the RF power amplifier.

9. The system of claim 1, wherein the switching pattern is configured to reduce the spectral components in the bias voltage in a frequency range of interest when switching among the plurality of discrete voltages.

10. The system of claim 9, wherein the frequency range of interest corresponds to a receive band of the RF amplifier system.

11. The system of claim 9, wherein the switching pattern comprises:
    a first transition from a first discrete voltage level to a second discrete voltage level;
    a second transition from the second discrete voltage level to the first discrete voltage level; and
    a third transition from the first discrete voltage level to the second discrete voltage level.

12. The system of claim 11, wherein:
    a duration between the first transition and the second transition has a time, $T_1$;
    a duration between the second transition and the third transition has a time, $T_2$; and
    times $T_1$ and $T_2$ are selected to reduce spectral components in the frequency range of interest resulting from switching among the plurality of discrete voltages.

13. The system of claim 1, wherein the RF amplifier is used in a transceiver operable in at least two different modes, wherein the controller is configured to adapt at least one setting of the at least one voltage modulator by using multi-pulse transitions when switching among the plurality of discrete voltages based, at least in part, on the mode in which the transceiver is operating.

14. The system of claim 13, wherein the at least one filter circuit comprises a reconfigurable circuit, wherein the controller is configured to adapt a configuration of the at least one filter circuit based, at least in part, on the mode in which the transceiver is operating.

15. A method of operating a radio frequency (RF) amplifier comprising at least one controller, at least one amplifier, at least one voltage modulator, and at least one filter, the method comprising:
    determining, by the at least one controller, one or more operating characteristics of the RF amplifier;
    switching, by the voltage modulator in response to the determining, a bias voltage of the at least one amplifier among a plurality of discrete voltages by using multi-pulse transitions, wherein the multi-pulse transitions reduce spectral components at an RF output port of the at least one amplifier, the spectral components resulting from switching among the plurality of discrete voltages.

16. The method of claim 15, further comprising:
    controlling, via the multi-pulse transitions, spectral components resultant from transitions in the bias voltage when switching among the plurality of discrete voltages.

17. The method of claim 16 wherein controlling the spectral components comprises selecting the characteristics of the pulses in the multi-pulse transitions to reduce the amplitude of spectral components resultant from transitions in the bias voltage when switching among the plurality of discrete voltages in at least a predetermined frequency range.

18. The method of claim 15, further comprising:
using single-pulse transitions when switching among the plurality of discrete voltages in response to the determined operating characteristics of the RF amplifier.

19. The method of claim 15, further comprising:
adapting, by the at least one controller, at least one setting of the at least one voltage modulator to transition the bias voltage among the discrete voltages by the at least one voltage modulator according to a switching pattern having two or more transition pulses, wherein a number, duration and timing of the one or more transition pulses is selected based on an operating mode of the RF power amplifier, and wherein the switching pattern is configured to reduce the spectral components in the bias voltage in a frequency range of interest when switching among the plurality of discrete voltages.

20. The method of claim 15, further comprising:
dynamically adapting, by the controller in response to the determined operating characteristics, a configuration of the at least one filter circuit, wherein the at least one filter circuit comprises a reconfigurable circuit.

21. A radio frequency (RF) amplifier system comprising:
at least one amplifier having an RF input port, an RF output port and a drain bias port;
at least one voltage modulator coupled to the bias port of the least one amplifier, each of the at least one voltage modulators operable to provide a selected bias voltage, the bias voltage selected by switching among a plurality of discrete voltages; and
a controller configured to dynamically adapt at least one setting of the at least one voltage modulator by using multi-pulse transitions when switching among the plurality of discrete voltages to provide the selected bias voltage in a first operating condition of the RF amplifier, wherein multi-pulse transitions reduce spectral components at the RF output port of the at least one amplifier, the spectral components resulting from switching among the plurality of discrete voltages.

22. The system of claim 21 further comprising at least one filter circuit coupled between the at least one voltage modulator and the at least one amplifier, the at least one filter circuit configured to control transitions in the bias voltage when switching among the plurality of discrete voltages.

23. The system of claim 21, wherein the controller is further configured to dynamically adapt the at least one setting of the at least one voltage modulator by using single-pulse transitions when switching among the plurality of discrete voltages in a second operating condition of the RF amplifier.

24. The system of claim 21 wherein said at least one filter circuit is a reconfigurable circuit, wherein the controller is configured to adapt a configuration of the at least one filter circuit.

25. The system of claim 21, wherein the controller is configured to adapt at least one setting of the at least one voltage modulator to transition the bias voltage among the discrete voltages by the at least one voltage modulator according to a switching pattern having two or more transition pulses, wherein a number, duration and timing of the one or more transition pulses is selected based on the operating mode of the RF power amplifier, and wherein the switching pattern is configured to reduce spectral components in the bias voltage.

* * * * *